US012796330B2

(12) United States Patent
Inoue et al.

(10) Patent No.: US 12,796,330 B2
(45) Date of Patent: Nov. 10, 2026

(54) SUBSTRATE

(71) Applicant: Murata Manufacturing Co., Ltd., Nagaokakyo (JP)

(72) Inventors: Takashi Inoue, Nagaokakyo (JP); Shozo Otera, Nagaokakyo (JP); Yutaka Ishiura, Nagaokakyo (JP); Jun Endo, Nagaokakyo (JP); Yoshihiko Nishizawa, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 979 days.

(21) Appl. No.: 17/974,322

(22) Filed: Oct. 26, 2022

(65) Prior Publication Data

US 2023/0049072 A1 Feb. 16, 2023

Related U.S. Application Data

(63) Continuation of application No. PCT/JP2022/013386, filed on Mar. 23, 2022.

(30) Foreign Application Priority Data

Jun. 17, 2021 (JP) ................................ 2021-100761

(51) Int. Cl.
*H01L 41/047* (2006.01)
*H10N 30/00* (2023.01)
(Continued)

(52) U.S. Cl.
CPC ......... *H10N 30/708* (2024.05); *H10N 30/872* (2023.02); *H10N 30/877* (2023.02); *H10N 30/20* (2023.02)

(58) Field of Classification Search
CPC .. H10N 30/708; H10N 30/872; H10N 30/877; H10N 30/20
(Continued)

(56) References Cited

U.S. PATENT DOCUMENTS

2011/0278362 A1 11/2011 Dokai et al.
2015/0311423 A1* 10/2015 Murakami ............. H04R 17/00 310/366
2020/0343437 A1 10/2020 Tominaga et al.

FOREIGN PATENT DOCUMENTS

JP 2005-278069 A 10/2005
JP 2011009709 A 1/2011
(Continued)

OTHER PUBLICATIONS

International Search Report in PCT/JP2022/013386, mailed Jun. 28, 2022, 2 pages.

*Primary Examiner* — Derek J Rosenau
(74) *Attorney, Agent, or Firm* — ArentFox Schiff LLP

(57) ABSTRACT

A substrate that includes a film-shaped member that has a first main surface and a second main surface; a first electrode that has a third main surface and a fourth main surface, the third main surface facing the second main surface of the film-shaped member, the first electrode having a first patterning region with a first part where the film-shaped member is exposed from the first electrode and a second part where the film-shaped member is not exposed from the first electrode; and an adhesive tape facing the fourth main surface of the first electrode and the second main surface of the film-shaped member such that the adhesive tape is disposed across the first part and the second part in the first patterning region.

15 Claims, 16 Drawing Sheets

(51) Int. Cl.
*H10N 30/87* (2023.01)
*H10N 30/20* (2023.01)

(58) Field of Classification Search
USPC .................................................. 310/365, 366
See application file for complete search history.

(56) References Cited

FOREIGN PATENT DOCUMENTS

| | | | | | |
|---|---|---|---|---|---|
| JP | 2011244109 | A | 12/2011 | | |
| JP | 2014072339 | A | 4/2014 | | |
| JP | 2020165887 | A | 10/2020 | | |
| WO | 2020137265 | A1 | 7/2020 | | |
| WO | WO-2021024567 | A1 * | 2/2021 | ............. | G06F 3/041 |

* cited by examiner

SUBSTRATE

CROSS REFERENCE TO RELATED APPLICATIONS

The present application is a continuation of International application No. PCT/JP2022/013386, filed Mar. 23, 2022, which claims priority to Japanese Patent Application No. 2021-100761, filed Jun. 17, 2021, the entire contents of each of which are incorporated herein by reference.

FIELD OF THE INVENTION

The present invention relates to a substrate attached to an electronic device or the like.

BACKGROUND OF THE INVENTION

The vibration structure described in Patent Document 1 includes a frame member, a piezoelectric film, a vibration unit, and a connection member. The connection member includes a first connection member and a second connection member. The first connection member connects the piezoelectric film and the frame member.

Patent Document 1: WO 2020/137265

SUMMARY OF THE INVENTION

In the case of attaching a film-shaped member to an object, it is desired to attach the film-shaped member such that it is unlikely to be peeled off from the object.

An object of the present invention is to provide a substrate with a film-shaped member unlikely to be peeled off from an object.

A substrate according to an embodiment of the present invention includes: a film-shaped member that has a first main surface and a second main surface; a first electrode that has a third main surface and a fourth main surface, the third main surface facing the second main surface of the film-shaped member, the first electrode having a first patterning region with a first part where the film-shaped member is exposed from the first electrode and a second part where the film-shaped member is not exposed from the first electrode; and an adhesive tape facing the fourth main surface of the first electrode and the second main surface of the film-shaped member such that the adhesive tape is disposed across the first part and the second part in the first patterning region.

The substrate according to the present invention has the film-shaped member, which is unlikely to be peeled off from the object.

BRIEF EXPLANATION OF THE DRAWINGS

FIG. 8A is a view illustrating a piezoelectric sheet 20X before patterning. FIG. 8B is a view illustrating the piezoelectric sheet 20 at the time of patterning. FIG. 8C is a view illustrating a side surface SD1 of the first electrode 201 and a side surface SD2 of the second electrode 202 after the patterning.

DETAILED DESCRIPTION OF THE INVENTION

First Embodiment

Figure 1:
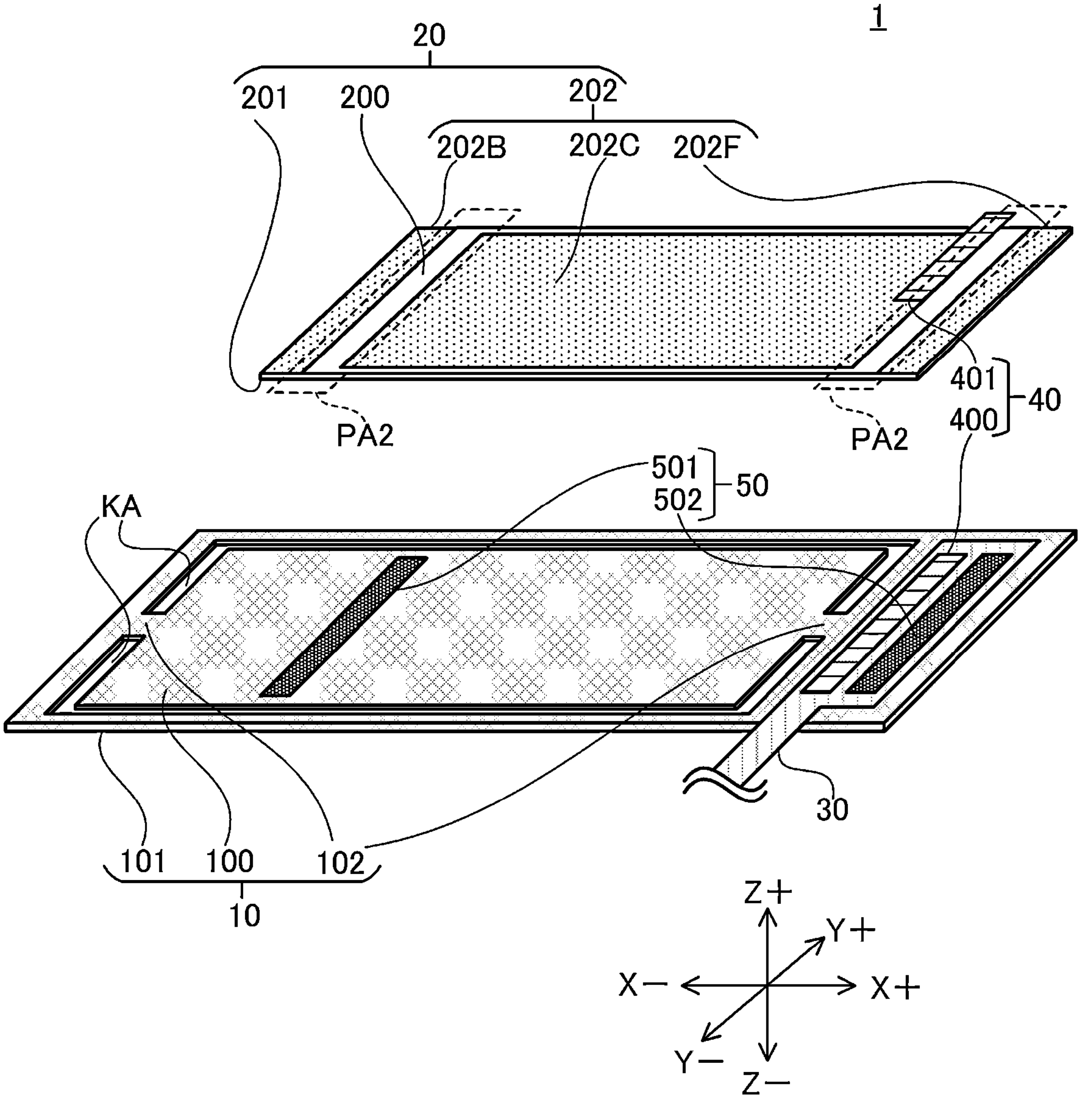
FIG. 1 is an exploded perspective view of a diaphragm 10 and a piezoelectric sheet 20.
Figure 2:
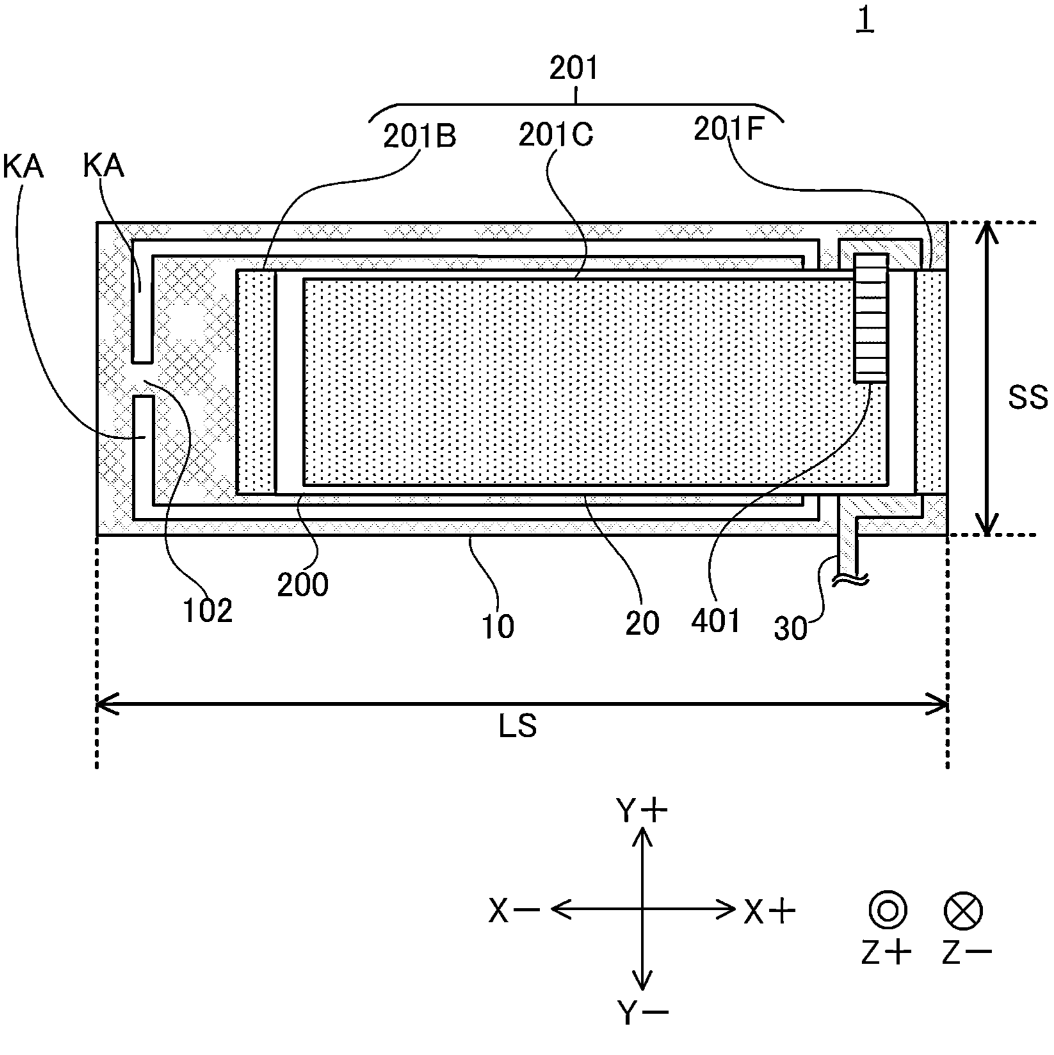
FIG. 2 is a top view of a substrate 1.
Figure 3:
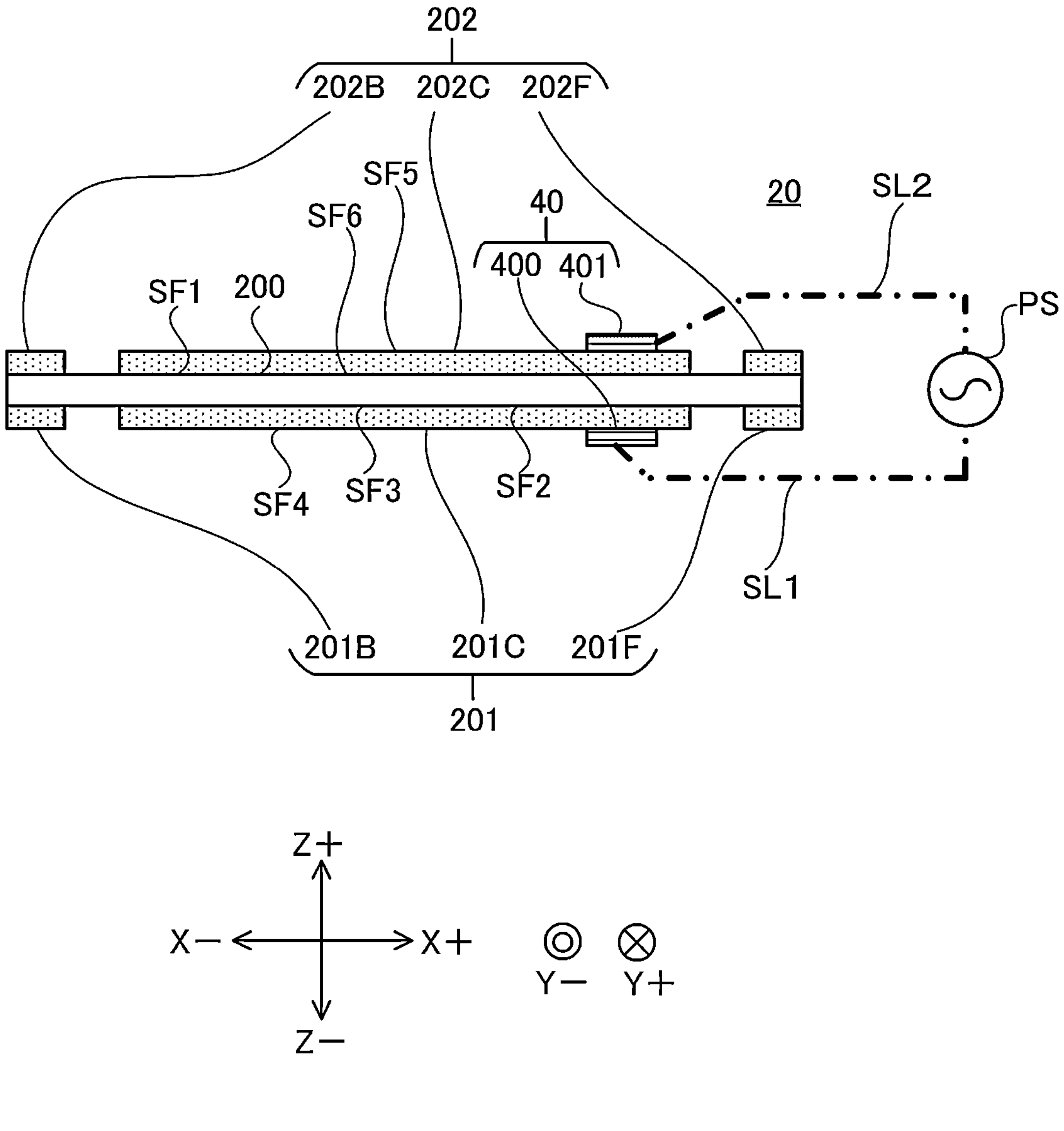
FIG. 3 is a sectional view of the piezoelectric sheet 20.
Figure 4:
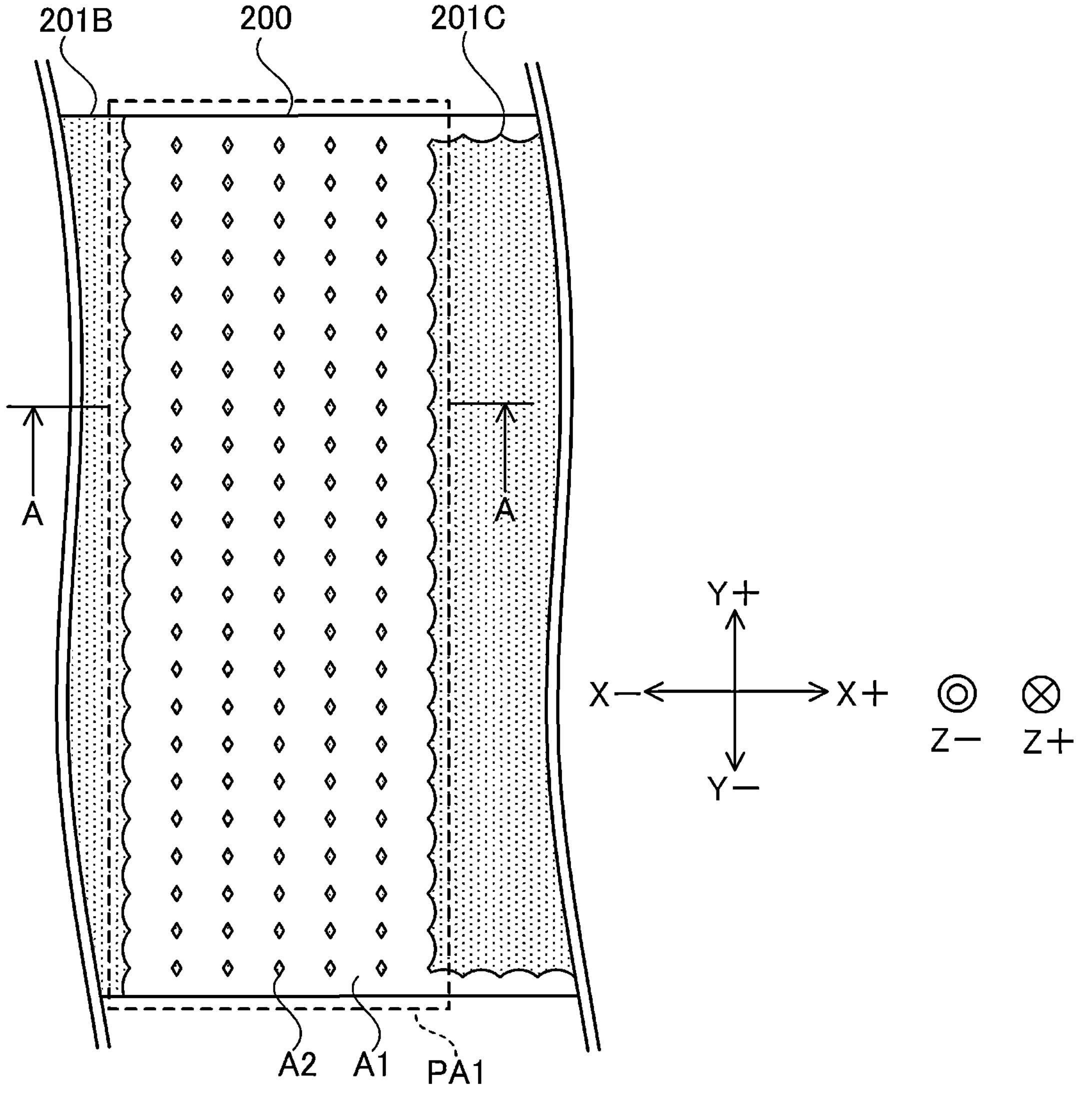
FIG. 4 is an enlarged view of a first patterning region PA1 in a first electrode 201.
Figure 5:
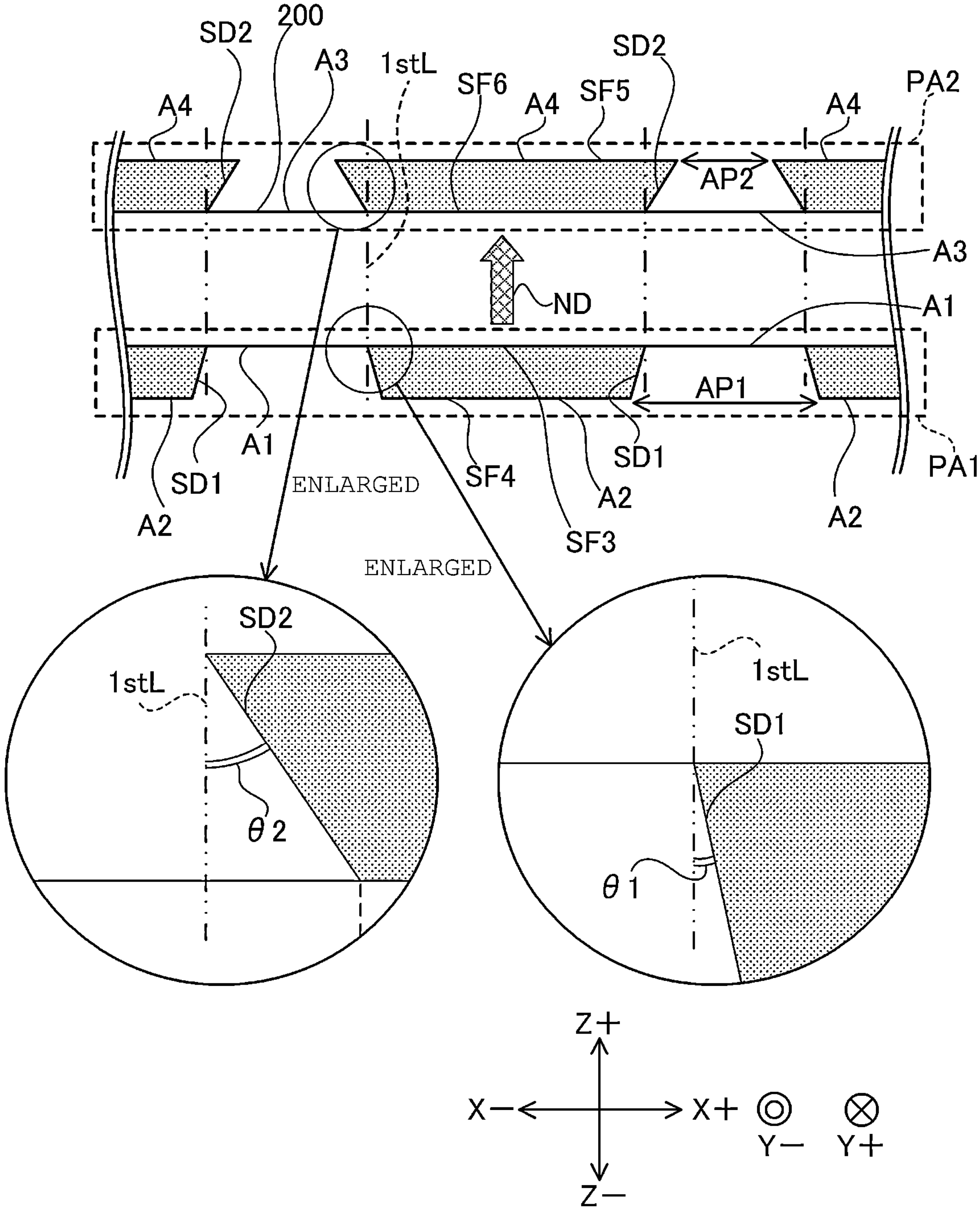
FIG. 5 is a sectional view of a section taken along A-A in FIG. 4.
Figure 6:
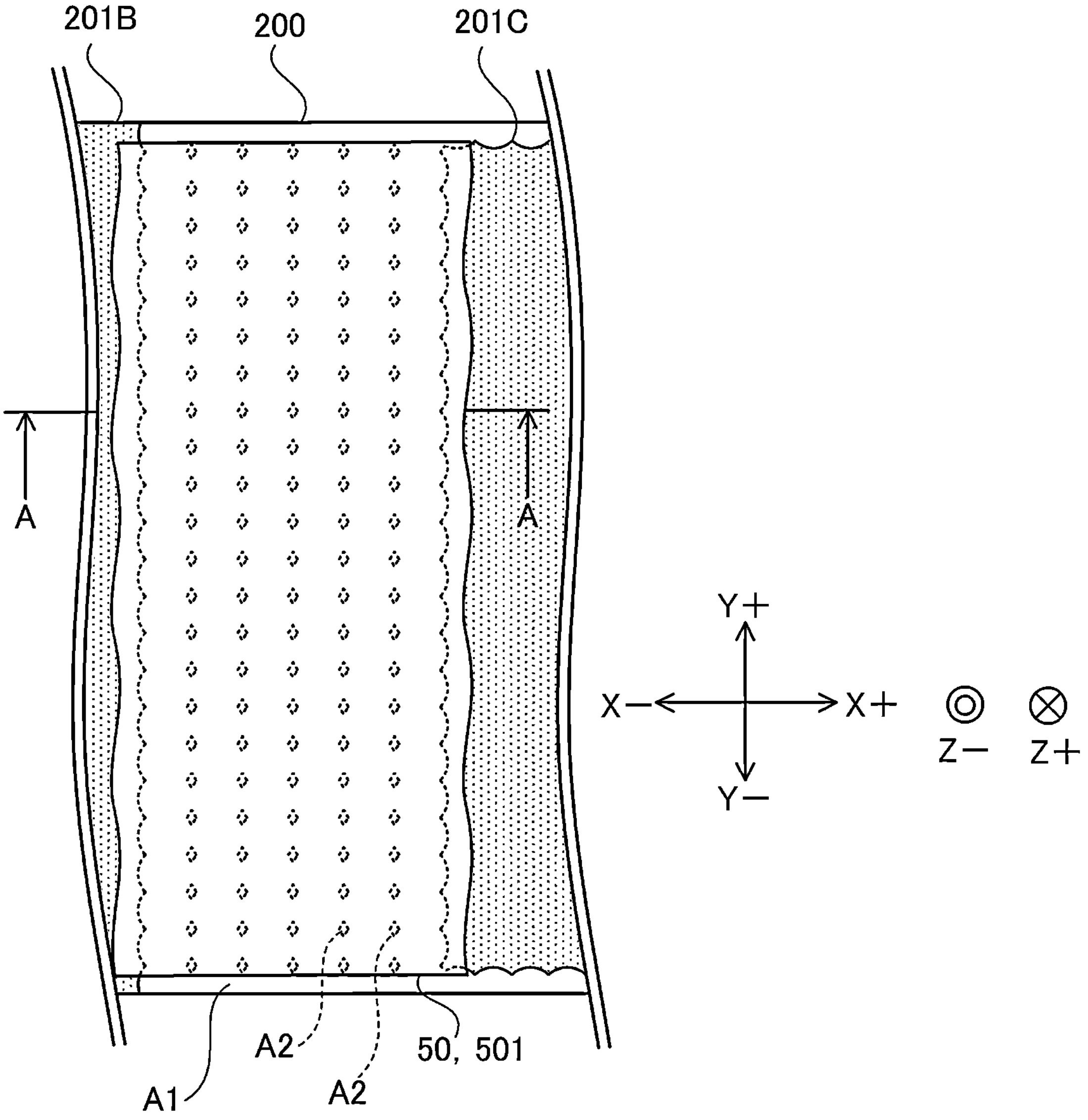
FIG. 6 is a view illustrating the piezoelectric sheet 20 with an adhesive tape 50 attached thereto at second parts A2.
Figure 7:
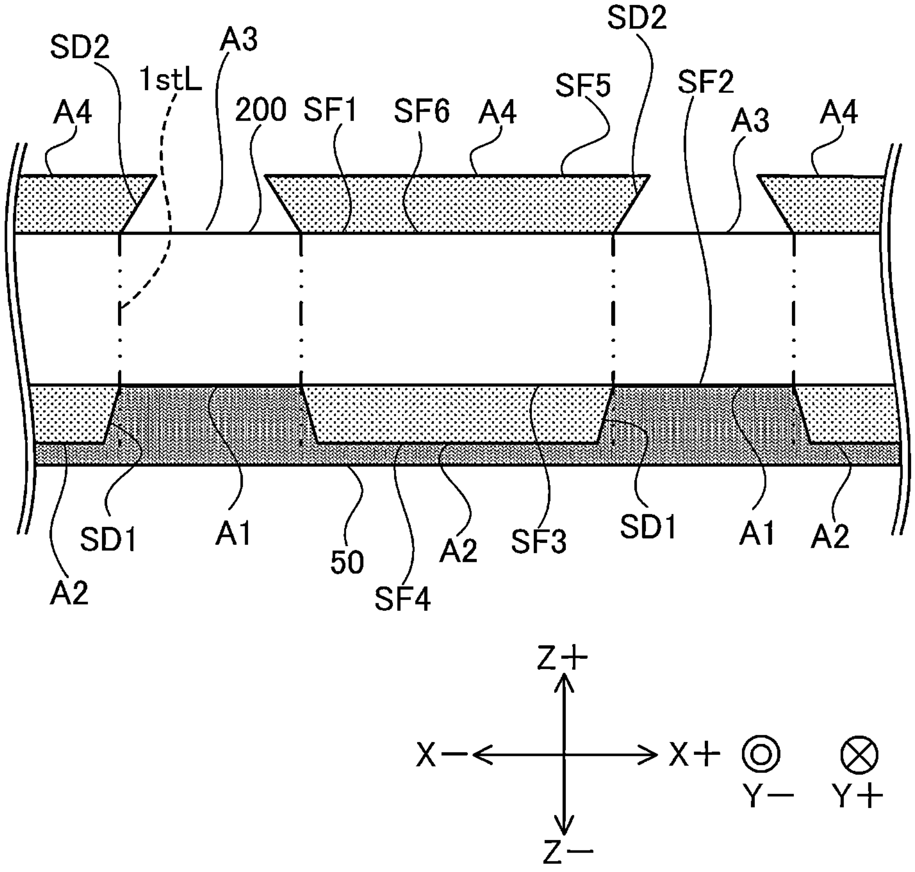
FIG. 7 is an enlarged view of the first patterning region PA1 with an adhesive tape 50 attached thereto.

A substrate 1 according to a first embodiment will be described below with reference to the drawings. FIG. 1 is an exploded perspective view of a diaphragm 10 and a piezoelectric sheet 20. FIG. 2 is a top view of a substrate 1. FIG. 3 is a sectional view of the piezoelectric sheet 20. FIG. 4 is an enlarged view of a first patterning region PA1 in a first electrode 201. FIG. 4 illustrates only a part of the first patterning region PAL Thus, a part of the illustration of the piezoelectric sheet 20 is omitted in FIG. 4. FIG. 5 is a sectional view of a section taken along A-A in FIG. 4. FIG. 6 is a view illustrating the piezoelectric sheet 20 with an adhesive tape 50 attached thereto at second parts A2. FIG. 7 is an enlarged view of the first patterning region PA1 with an adhesive tape 50 attached thereto.

As an example, the substrate 1 functions as an actuator that generates vibrations. The substrate 1 is attached, for example, in an electronic device (not shown). Thus, the substrate 1 can cause the electronic device to vibrate. The substrate 1 includes, as illustrated in FIG. 1, a diaphragm 10, a piezoelectric sheet 20, an FPC (Flexible Printed Circuit) 30, an extended electrode 40, and an adhesive tape 50. As illustrated in FIG. 1, the diaphragm 10 and the piezoelectric sheet 20 are arranged in the stacking direction. In this regard, the direction in which the diaphragm 10 and the piezoelectric sheet 20 are arranged is defined as a Z-axis direction. As illustrated in FIG. 1, the direction in which the diaphragm 10 and the piezoelectric sheet 20 are arranged in this order is a Z+ direction.

The diaphragm 10 has a plate shape as illustrated in FIGS. 1 and 2. The diaphragm 10 has a rectangular shape in a planar view of the substrate 1. Thus, as illustrated in FIG. 2, the diaphragm 10 has a long side LS and a short side SS. The long side LS and the short side SS are orthogonal to each other. The diaphragm 10 has a thickness in a direction orthogonal to the long side LS and the short side SS. In this regard, as illustrated in FIG. 2, the direction in which the long side LS extends is defined as an X direction. The direction in which the short side SS extends is defined as a Y direction.

The diaphragm 10 includes, as illustrated in FIG. 1, a central member 100, a frame member 101, and one or more beams 102. The frame member 101 surrounds the periphery of the central member 100 in a planar view of the substrate 1. According to the present embodiment, the central member 100 and the frame member 101 are connected by the two beams 102. According to the present embodiment, the diaphragm 10 is provided with two openings KA. The openings KA are surrounded by the central member 100, the frame member 101, and the beams 102 in a planar view of the substrate 1. The diaphragm 10 is made of a material that has high workability, durability, and rigidity, for example. More specifically, the diaphragm 10 is formed from SUS (Steel Use Stainless), for example.

The piezoelectric sheet 20 includes a film-shaped member 200, a first electrode 201, and a second electrode 202. The film-shaped member 200 is, as illustrated in FIG. 3, located between the first electrode 201 and the second electrode 202. The film-shaped member 200 is, according to the present embodiment, a member that deforms in the planar direction when a voltage is applied. In this case, the film-shaped member 200 is made of a piezoelectric material. The piezoelectric material is, for example, a polyvinylidene fluoride (PVDF). According to the present embodiment, the planar direction is a direction parallel to the X-axis direction and the Y-axis direction. The film-shaped member 200 has, as illustrated in FIGS. 1 and 2, a rectangular shape. According to the present embodiment, the length of the film-shaped member 200 in the Y-axis direction is smaller than the length of the film-shaped member 200 in the X-axis direction. The film-shaped member 200 has, as illustrated in FIG. 3, a first main surface SF1 and a second main surface SF2. The first main surface SF1 and the second main surface SF2 are arranged in this order in the Z+ direction.

The first electrode 201 is a signal electrode. The first electrode 201 is, as illustrated in FIG. 3, provided on the first main surface SF1. Specifically, the first electrode 201 has, as illustrated in FIG. 3, a third main surface SF3 and a fourth main surface SF4. The fourth main surface SF4 and the third main surface SF3 are arranged in this order in the Z+ direction. The third main surface SF3 is disposed to face the second main surface SF2 of the film-shaped member 200. In this regard, the second main surface SF2 and the third main surface SF3 are in contact with each other. A part of the first electrode 201 is subjected to patterning. Specifically, the patterning means etching the first electrode 201 to form a site where the first electrode 201 is electrically divided. Thus, as illustrated in FIGS. 3 and 4, the piezoelectric sheet 20 has a part where the film-shaped member 200 is exposed from the first electrode 201. Accordingly, the first electrode 201 covers most of the first main surface SF1, but is not formed on the whole surface of the first main surface SF1. The method for the patterning as mentioned above is, for example, laser etching of irradiating the first electrode 201 with a laser.

According to the present embodiment, as illustrated in FIGS. 1 and 3, the first electrode 201 is divided by patterning into three parts. Specifically, the first electrode 201 is divided into a first end 201B, a central part 201C, and a second end 201F. The first end 201B, the central part 201C, and the second end 201F are arranged in the X-axis direction. In this regard, the direction in which the first end 201B, the central part 201C, and the second end 201F are arranged in this order is defined as an X+ direction. In addition, the direction orthogonal to the Z+ direction and the X+ direction is defined as a Y+ direction. The direction opposite to the Y+ direction is defined as a Y− direction. The first end 201B and the second end 201F are located at ends of the first electrode 201. The first end 201B, the central part 201C, and the second end 201F are not electrically connected to each other. Specifically, the periphery of the central part 201C is surrounded by the exposed film-shaped member 200 in a planar view. Further, in a planar view of the substrate 1, a part of the region subjected to the patterning in the first electrode 201 is located between the first end 201B and the central part 201C. Hereinafter, a region located between the first end 201B and the central part 201C and subjected to the patterning in the first electrode 201 is referred to as a first patterning region PA1 (see FIG. 4). In other words, the first electrode 201 has the first patterning region PA1.

The second electrode 202 is, for example, a signal electrode. The second electrode 202 is, as illustrated in FIG. 3, provided on the first main surface SF1. Specifically, the second electrode 202 has, as illustrated in FIG. 3, a fifth main surface SF5 and a sixth main surface SF6. The sixth main surface SF6 and fifth main surface SF5 are arranged in this order in the Z+ direction. The sixth main surface SF6 is, as illustrated in FIG. 3, disposed to face the first main surface SF1 of the film-shaped member 200. In this regard, as illustrated in FIG. 3, the first main surface SF1 and the sixth main surface SF6 are in contact with each other. A part of the second electrode 202 is subjected to patterning. Thus, as with the first electrode 201, the piezoelectric sheet 20 has a part where the film-shaped member 200 is exposed from the second electrode 202 (see FIGS. 1, 2, and 3). Accordingly, the second electrode 202 covers most of the second main surface SF2, but is not formed on the whole surface of the second main surface SF2. According to the present embodiment, as with the first electrode 201, the second electrode 202 is divided by patterning into three parts (see FIGS. 1 and 3). Specifically, the second electrode 202 is divided into a first end 202B, a central part 202C, and a second end 202F. The first end 202B, the central part 202C, and the second end 202F are arranged in this order in the X+ direction. The first end 202B, the central part 202C, and the second end 202F are not electrically connected to each other. Specifically, the periphery of the central part 202C is surrounded by the exposed film-shaped member 200 in a planar view. Further, in a planar view of the substrate 1, a part of the region subjected to the patterning in the second electrode 202 is located between the first end 202B and the central part 202C. Hereinafter, a region located between the first end 202B and the central part 202C and subjected to the patterning in the second electrode 202 is referred to as a second patterning region PA2 (see FIG. 1). In other words, the second electrode 202 has the second patterning region PA2.

It is to be noted that either one of the first electrode 201 and the second electrode 202 may be a ground electrode.

The FPC 30 is a wiring member for applying a voltage to the first electrode 201 and the second electrode 202. The FPC 30 is provided with a first signal line SL1. The first signal line SL1 is, as illustrated in FIG. 3, electrically connected to an alternate-current power supply PS. Similarly, the FPC 30 is provided with a second signal line SL2. The second signal line SL2 is electrically connected to the alternate-current power supply PS. The FPC 30 is, as illustrated in FIG. 1, provided on the diaphragm 10. The FPC 30 is fixed to the diaphragm 10. In this case, the FPC 30 is located between the diaphragm 10 and the piezoelectric sheet 20.

The extended electrode 40 electrically connects the piezoelectric sheet 20 and the alternate-current power supply PS. Specifically, the extended electrode 40 includes a first extended electrode 400 and a second extended electrode 401. The first extended electrode 400 is, as illustrated in FIGS. 1 and 3, provided on the FPC 30. In this regard, the first extended electrode 400 is electrically connected to the first signal line SL1. Accordingly, the first electrode 201 and the alternate-current power supply PS are electrically connected via the first extended electrode 400. The second extended electrode 401 is, as illustrated in FIGS. 1, 2, and 3, provided on the central part 202C. In this regard, the second extended electrode 401 is electrically connected to the second signal line SL2. Accordingly, the second electrode 202 and the alternate-current power supply PS are electrically connected via the second extended electrode 401.

The adhesive tape 50 is a tape that has an insulating property and an adhesive property. As illustrated in FIG. 1, the adhesive tape 50 bonds the diaphragm 10 and the piezoelectric sheet 20. Specifically, the adhesive tape 50 is located between the diaphragm 10 and the piezoelectric sheet 20. More specifically, as illustrated in FIGS. 1 and 7, the adhesive tape 50 is disposed to face the fourth main surface SF4 of the first electrode 201 and the second main surface SF2 of the film-shaped member 200. The adhesive tape 50 is overlapped with the first patterning region PA1 in a planar view of the substrate 1. Accordingly, the adhesive tape 50 is bonded to the film-shaped member 200 and the first electrode 201 in the first patterning region PA1. The adhesive tape 50 is fixed to the diaphragm 10. According to the present embodiment, the adhesive tape 50 includes a first adhesive tape 501 and a second adhesive tape 502. The first adhesive tape 501 and the second adhesive tape 502 are arranged in this order in the X+ direction. The first adhesive tape 501 is fixed to the central member 100. The second adhesive tape 502 is fixed to the FPC 30.

The substrate 1 is vibrated by the configuration mentioned above. Specifically, as illustrated in FIG. 3, the first electrode 201 and the second electrode 202 are electrically connected to the alternate-current power supply PS. The alternate-current power supply PS is driven by a driving circuit (not shown). Thus, when the alternate-current power supply PS is driven, an alternate-current voltage is applied to the first electrode 201 and the second electrode 202. In this case, the film-shaped member 200 is deformed so as to be extended in the X-axis direction, or the film-shaped member 200 is deformed so as to be contracted in the X-axis direction. In this case, the diaphragm 10 fixed to the piezoelectric sheet 20 vibrates in the X-axis direction.

According to the present embodiment, the adhesive tape 50 bonds the diaphragm 10 and the piezoelectric sheet 20 in the first patterning region PAL Thus, the diaphragm 10 and the piezoelectric sheet 20 are unlikely to be peeled off. This structure will be described in detail below.

As illustrated in FIGS. 4 and 5, the first patterning region PA1 has a first part A1 and second parts A2. In other words, in the first patterning region PA1, the first electrode 201 has the first part A1 and the second parts A2.

The first part A1 is a part where the film-shaped member 200 is exposed from the first electrode 201. Accordingly, the first part A1 has no first electrode 201 formed. In this case, the fourth main surface SF4 of the first electrode 201 has an opening AP1. In other words, the first part A1 has the opening AP1 instead of the fourth main surface SF4 of the first electrode 201. Accordingly, the distance between the opening AP1 and the film-shaped member 200 is equal to the distance between the third main surface SF3 and the fourth main surface SF4.

The second parts A2 are parts where the film-shaped member 200 is not exposed from the first electrode 201. As illustrated in FIG. 4, according to the present embodiment, the second parts A2 are surrounded by the first part A1 in a planar view of the substrate 1. According to the present embodiment, the first patterning region PA1 has a plurality of second parts A2. Specifically, the plurality of second parts A2 are arranged in the Y-axis direction. The intervals at which the plurality of second parts A2 are each arranged are equal intervals. Further, the plurality of second parts A2 arranged in the Y-axis direction are not in contact with each other. Similarly, according to the present embodiment, as illustrated in FIG. 6, the plurality of second parts A2 are arranged in the X-axis direction. The plurality of second parts A2 arranged in the X-axis direction are not in contact with each other. It is to be noted that the plurality of second parts A2 are not necessarily arranged at equal intervals in the Y-axis direction. It is to be noted that the plurality of second parts A2 are not necessarily arranged at equal intervals in the X-axis direction.

As illustrated in FIGS. 5 and 7, the side surface SD1 of the first electrode 201 at the second part A2 is inclined with respect to the normal direction ND of the first main surface SF1 and second main surface SF2 in a side view of the substrate 1. According to the present embodiment, the first electrode 201 in the first patterning region PA1 has a shape tapered in the Z-direction. Accordingly, the area of the third main surface SF3 of the first electrode 201 at the first part A1 is smaller than the area of the opening AP1 of the fourth main surface SF4. In this case, the area of the third main surface SF3 of the first electrode 201 at the second parts A2 is larger than the area of the fourth main surface SF4 of the first electrode 201 at the second parts A2.

As illustrated in FIG. 6, the adhesive tape 50 is disposed so as to cover the first patterning region PA1. Accordingly, as illustrated in FIGS. 6 and 7, the adhesive tape 50 is disposed across the first part A1 and the second parts A2 in the first patterning region PA1. Specifically, as illustrated in FIG. 7, the adhesive tape 50 is bonded to the film-shaped member 200 exposed from the first electrode 201 at the first part A1. Thus, the adhesive tape 50 bonds the film-shaped member 200 and the diaphragm 10. Similarly, the adhesive tape 50 is bonded to the fourth main surface SF4 of the first electrode 201 at the second parts A2. Further, the adhesive tape 50 is bonded to the side surface SD1 of the first electrode 201 at the second parts A2. In other words, the adhesive tape 50 bonds the first electrode 201 and the diaphragm 10. The configuration mentioned above bonds the diaphragm 10 and the piezoelectric sheet 20.

As illustrated in FIG. 5, the second patterning region PA2 has a third part A3 and a fourth part A4.

The third part A3 is a part where the film-shaped member 200 is exposed from the second electrode 202. Accordingly, the third part A3 has no second electrode 202 formed. In this case, the fifth main surface SF5 of the second electrode 202 has an opening AP2. In other words, the third part A3 has the opening AP2 instead of the fifth main surface SF5 of the second electrode 202. The distance between the opening AP2 and the film-shaped member 200 is equal to the distance between the fifth main surface SF5 and the sixth main surface SF6. In a planar view of the substrate 1, the first part A1 and the third part A3 are overlapped with each other.

The fourth parts A4 are parts where the film-shaped member 200 is not exposed from the second electrode 202.

As with the first electrode 201, according to the present embodiment, the third parts A3 are surrounded by the fourth part A4 in a planar view of the substrate 1. According to the present embodiment, the second patterning region PA2 has a plurality of fourth parts A4. Specifically, the plurality of fourth parts A4 are arranged in the Y-axis direction. The intervals at which the plurality of fourth parts A4 are each arranged are equal intervals. The plurality of fourth parts A4 arranged in the Y-axis direction are not in contact with each other. Similarly, according to the present embodiment, the plurality of fourth parts A4 are arranged in the X-axis direction. The plurality of fourth parts A4 arranged in the X-axis direction are not in contact with each other. It is to be noted that the plurality of fourth parts A4 are not necessarily arranged at equal intervals in the Y-axis direction. It is to be noted that the plurality of fourth parts A4 are not necessarily arranged at equal intervals in the X-axis direction. In a planar view of the substrate 1, the second parts A2 and the fourth parts A4 are overlapped with each other.

At the fourth parts A4, the side surface SD2 of the second electrode 202 is inclined. Specifically, as illustrated in FIG. 5, the side surface SD2 of the second electrode 202 at the fourth part A4 is inclined with respect to the normal direction ND in a side view of the substrate 1. Thus, according to the present embodiment, the sectional area of the second electrode 202 at the third part A3 is increased with distance from the film-shaped member 200. Accordingly, as illustrated in FIG. 7, the area of the sixth main surface SF6 of the fourth parts A4 is smaller than the area of the fifth main surface SF5 of the fourth parts A4. Further, as illustrated in FIG. 5, the area of the sixth main surface SF6 at the third part A3 of the second patterning region PA2 is smaller than the area of the opening AP2 of the fifth main surface SF5.

The inclination angle of the side surface SD2 of the second electrode 202 is different from the inclination angle of the side surface SD1 of the first electrode 201. Details will be described below. First, a first straight line 1stL extending in the normal direction ND is defined. When the first straight line 1stL is defined, the first angle θ1 made by the side surface SD1 of the first electrode 201 at the second part A2 and the first straight line 1stL is then defined in a side view of the substrate 1. Similarly, when the first straight line 1stL is defined, the second angle θ2 made by the side surface SD2 of the second electrode 202 at the fourth part A4 and the first straight line 1stL is defined in the side view of the substrate 1. In this case, the magnitude of the first angle θ1 is smaller than the magnitude of the second angle θ2.

(Advantageous Effect of First Embodiment)

The substrate 1 makes the film-shaped member 200 unlikely to be peeled off from the object. More specifically, the substrate 1 includes the film-shaped member 200, the first electrode 201, and the adhesive tape 50. The film-shaped member 200 has the first main surface SF1 and the second main surface SF2. The first electrode 201 has the third main surface SF3 and the fourth main surface SF4. The third main surface SF3 of the first electrode 201 is disposed to face the second main surface SF2 of the film-shaped member 200. The adhesive tape 50 is disposed to face the fourth main surface SF4 of the first electrode 201 and the second main surface SF2 of the film-shaped member 200. The first electrode 201 has the first patterning region PA1. The first patterning region PA1 has the first part A1 where the film-shaped member 200 is exposed from the first electrode 201 and the second parts A2 where the film-shaped member 200 is not exposed from the first electrode 201. Further, the adhesive tape 50 is disposed across the first part A1 and the second parts A2 in the first patterning region PA1. In the case of the configuration mentioned above, the adhesive tape 50 is bonded to the fourth main surface SF4 of the first electrode 201 at the second parts A2 in addition to the first part A1. In this case, the area of the first electrode 201 bonded to the adhesive tape 50 is increased as compared with the case without any second part A2. Thus, the adhesive strength between the adhesive tape 50 and the piezoelectric sheet 20 is increased. Accordingly, the diaphragm 10 and the piezoelectric sheet 20 are made unlikely to be peeled off. More specifically, the film-shaped member 200 is unlikely to be peeled off from the diaphragm 10, which is an example of the object according to the present embodiment.

The substrate 1 makes the film-shaped member 200 unlikely to be peeled off from the object. More specifically, the adhesive tape 50 is bonded to the side surface SD1 of the first electrode 201 at the second part A2. Thus, the area of the first electrode 201 bonded to the adhesive tape 50 is increased as compared with the case where only the adhesive tape 50 and the third main surface SF3 of the first electrode 201 are bonded to each other. Specifically, the area of the first electrode 201 bonded to the adhesive tape 50 increases by the area of the side surface SD1 of the first electrode 201 at the second part A2. Accordingly, the adhesive strength between the adhesive tape 50 and the piezoelectric sheet 20 is increased. As a result, the diaphragm 10 and the piezoelectric sheet 20 are made unlikely to be peeled off. More specifically, the film-shaped member 200 is unlikely to be peeled off from the diaphragm 10, which is an example of the object according to the present embodiment.

The substrate 1 makes the film-shaped member 200 unlikely to be peeled off from the object. More specifically, the side surface SD1 of the first electrode 201 at the second part A2 is inclined with respect to the normal direction ND of the first main surface SF1 and second main surface SF2 in a side view of the substrate 1. The configuration mentioned above increases the area of the first electrode 201 bonded to the adhesive tape 50. The area of the side surface SD1 of the first electrode 201 at the second part A2 is increased as compared with the case where the side surface SD1 of the first electrode 201 at the second part A2 is parallel to the normal direction ND. Accordingly, the area of the first electrode 201 bonded to the adhesive tape 50 is increased. Thus, the adhesive strength between the adhesive tape 50 and the piezoelectric sheet 20 is increased. As a result, the diaphragm 10 and the piezoelectric sheet 20 are made unlikely to be peeled off. More specifically, the film-shaped member 200 is unlikely to be peeled off from the diaphragm 10, which is an example of the object according to the present embodiment.

(Process for Manufacturing First Electrode 201 and Second Electrode 202)

Figures 8A, 8B, 8C:
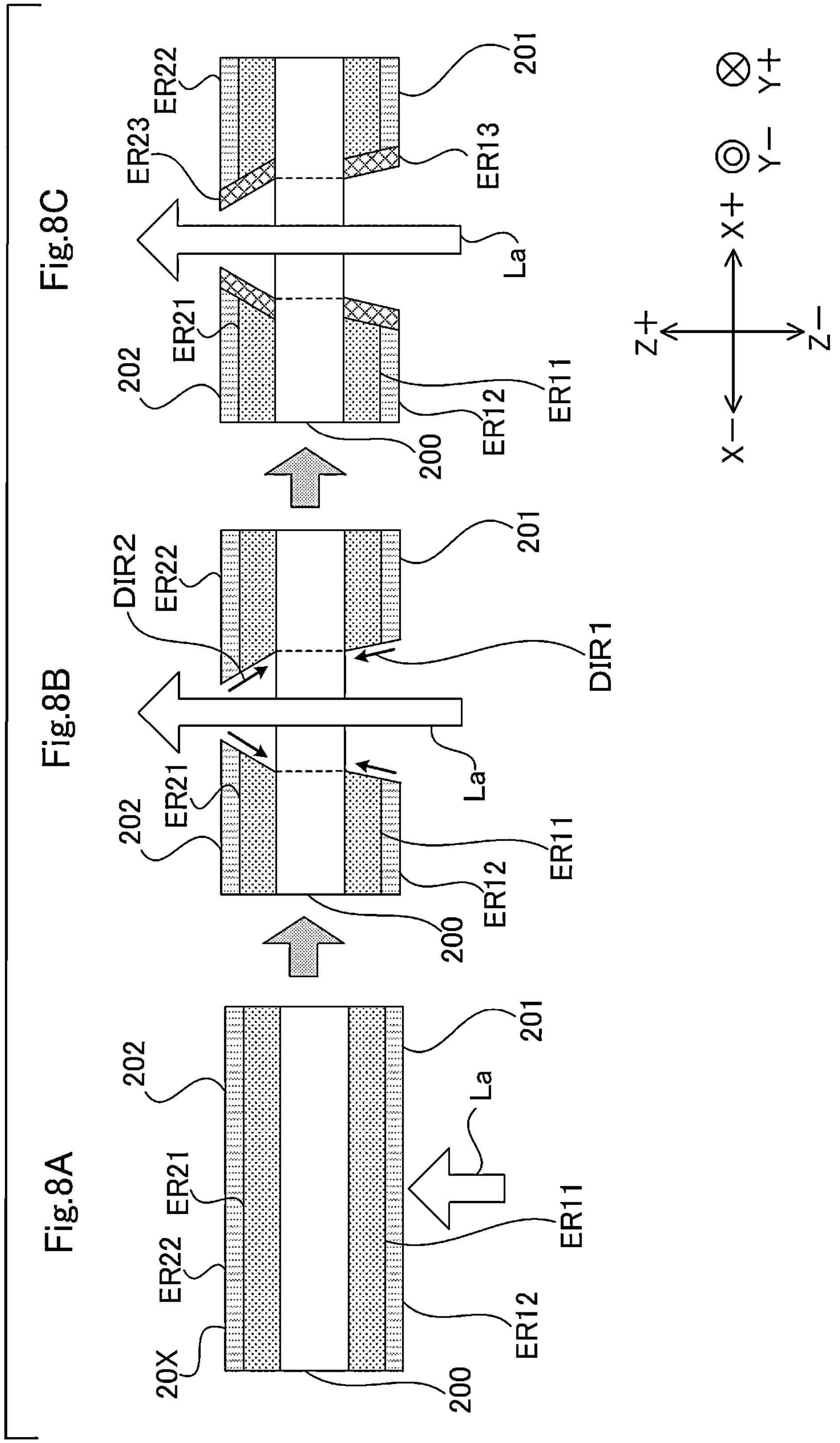
FIGS. 8A to 8C are views illustrating a process for manufacturing the first electrode 201 and a second electrode 202.

A process for manufacturing the first electrode 201 and the second electrode 202 will be described with reference to the drawings. FIG. 8 is a view illustrating a process for manufacturing the first electrode 201 and the second electrode 202. FIG. 8 includes FIGS. 8A, 8B, and 8C.

FIG. 8A is a view illustrating a piezoelectric sheet 20X before patterning. FIG. 8B is a view illustrating the piezoelectric sheet 20 at the time of patterning. FIG. 8C is a view illustrating a side surface SD1 of the first electrode 201 and a side surface SD2 of the second electrode 202 after the patterning.

First, the first electrode 201 is provided on the second main surface SF2 of the film-shaped member 200. The method for providing the first electrode 201 on the film-shaped member 200 is, for example, a sputtering method, a vapor deposition method, or the like. In the same manner as the first electrode 201, the second electrode 202 is provided on the first main surface SF1 of the film-shaped member 200. Thus, as illustrated in FIG. 8A, the piezoelectric sheet 20X is formed.

Next, the first electrode 201 of the piezoelectric sheet 20X is subjected to patterning with a laser. Details of the patterning with a laser will be described below.

First, as illustrated in FIG. 8, the first electrode 201 is irradiated with a laser La. In the example illustrated in FIG. 8, the irradiation with the laser La is performed in the Z+ direction. In this case, high heat is generated in a region of the first electrode 201 irradiated with the laser La. The first electrode 201 is melted or evaporated by the high heat. In this case, the first electrode 201 in the region irradiated with the laser La is removed. The first electrode 201 is removed, thereby causing the laser La to penetrate the first electrode 201 as illustrated in FIG. 8B. In this case, a part of the first electrode 201 removed is included in the first part A1.

After the laser La penetrates the first electrode 201, the laser La reaches the film-shaped member 200. The film-shaped member 200 is formed from a material (for example, PVDF) that is less likely to absorb laser light. Accordingly, the laser La reaching the film-shaped member 200 passes through the film-shaped member 200 as illustrated in FIG. 8B. In this case, the second electrode 202 is irradiated with the laser La passing through the film-shaped member 200. High heat is generated in a region of the second electrode 202 irradiated with the laser La. The second electrode 202 is melted or evaporated by the high heat. As a result, the second electrode 202 in the region irradiated with the laser La is removed. After the removal, the irradiation with the laser La is stopped. In this case, a part of the second electrode 202 removed is included in the third part A3. Through the foregoing steps, the first irradiation with the laser La is completed.

Next, the position of the first electrode 201 irradiated with the laser La is changed. For example, after the first laser irradiation, the position irradiated with the laser La is changed to the Y-axis direction. After the change, the first electrode 201 is irradiated with the laser La for the second time. The second irradiation with the laser La further removes the first electrode 201 and the second electrode 202.

The laser irradiation repeats the change of the irradiated position of the laser La and the irradiation with the laser La. Thus, the first electrode 201 and the second electrode 202 are irradiated with the laser La multiple times. As a result, as illustrated in FIG. 5, the first part A1 is formed to extend in the Y-axis direction. Such laser irradiation is performed with, for example, a pulse laser for laser irradiation at regular intervals.

In the same manner as in the Y-axis direction, the position irradiated with the laser La is changed to the X-axis direction. After the change, the first electrode 201 is irradiated with the laser La. Thus, the first electrode 201 and the second electrode 202 are further removed. As a result, as illustrated in FIG. 5, the first part A1 is formed to extend in the X-axis direction.

Through the foregoing steps, the patterning for the first electrode 201 and the second electrode 202 according to the present embodiment is completed.

It is to be noted that the size of the second part A2 of the first electrode 201 can be adjusted by adjusting the parameters of the laser La. The parameters of the laser La are, for example, the power of the laser La, the irradiation cycle of the laser La, the speed of moving the laser irradiator, and the like.

According to the present embodiment, the speed of moving the laser irradiator is, for example, the speed of moving the position irradiated with the laser La on the first electrode 201. For example, when the speed of moving the laser irradiator is 1000 mm/sec, the position irradiated with the laser La on the first electrode 201 is moved by 1000 mm for 1 second.

According to the present embodiment, the irradiation cycle of the laser La is an interval of time at which the laser irradiation is performed per unit time. For example, when the irradiation cycle of the laser La is 10 msec, the irradiation with the laser La is performed at an interval of every 10 msec.

The size of the second part A2 can be adjusted by adjusting the power of the laser La. For example, when the power of the laser La is reduced, the magnitude of the energy applied to the first electrode 201 will be decreased. In this case, the size of the first part A1 will be decreased. Thus, the size of the second part A2 of the first electrode 201 can be adjusted.

The size of the second part A2 can be adjusted by adjusting the speed of moving the laser irradiator. For example, when the speed of moving the laser irradiator is increased, the distance is increased between the regions of the first electrode 201 irradiated with the laser La. In this case, the region of the first electrode 201 etched per unit time is decreased. Thus, the size of the second part A2 can be adjusted.

The size of the second part A2 can be adjusted by adjusting the irradiation cycle of the laser La. For example, when the irradiation cycle of the laser La is shortened, the region of the first electrode 201 etched per unit time is increased. Thus, the size of the second part A2 can be adjusted.

In the same manner as for the first electrode 201, the size of the fourth part A4 of the second electrode 202 can be adjusted by adjusting the parameters of the laser La.

(Materials for First Electrode 201 and Second Electrode 202)

Figure 9:
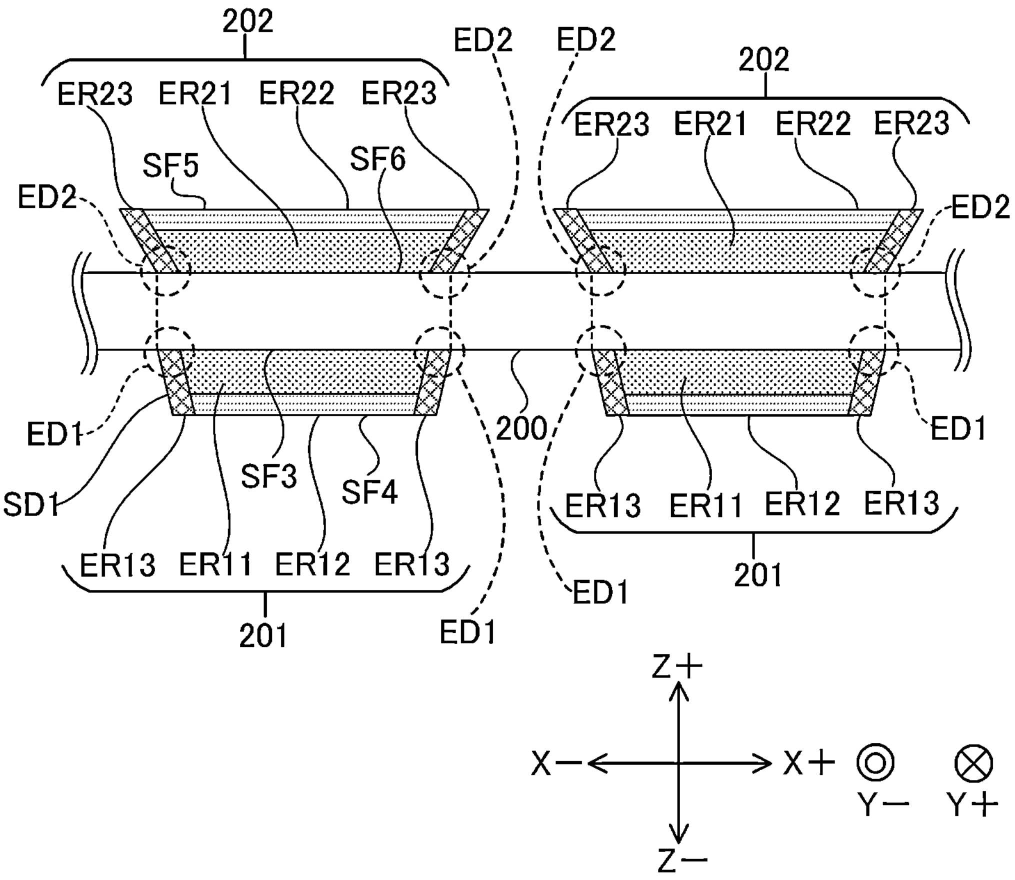
FIG. 9 is a view illustrating materials for the first electrode 201.

Materials for the first electrode 201 the second electrode 202 will be described below in detail with reference to FIGS. 8 and 9. FIG. 9 is a view illustrating the materials for the first electrode 201.

As illustrated in FIGS. 8 and 9, the first electrode 201 includes a first metal ER11, a second metal ER12, and a third metal ER13. As illustrated in FIG. 9, the first metal ER11 is located close to the third main surface SF3 of the first electrode 201. In this case, the first metal ER11 and the film-shaped member 200 are in contact with each other. The second metal ER12 is located close to the fourth main surface SF4 of the first electrode 201. In this case, the second metal ER12 and the first metal ER11 are in contact with each other. In contrast, the second metal ER12 and the film-shaped member 200 are not in contact with each other. The third metal ER13 is located close to the side surfaces SD1 of the first electrode 201 at the second parts A2. Accordingly, the third metal ER13 and the first metal ER11 are in contact with each other. In addition, the third metal ER13 and the second metal ER12 are in contact with each other. The periphery of the first metal ER11 is surrounded by the second metal ER12 and the third metal ER13. In this case, the third metal ER13 is in contact with the second main surface SF2 of the film-shaped member 200. In this case, parts of ends ED1 of the first electrode 201 are formed from the third metal ER13.

The materials of the first metal ER11, second metal ER12, and third metal ER13 are different from each other. The first metal ER11 contains, for example, copper. The second metal ER12 is higher in light absorbance than the first metal ER11. In this case, the second metal ER12 contains, for example, nickel. The third metal ER13 is made of an alloy of the first metal ER11 and the second metal ER12. For example, when the first metal ER11 and the second metal ER12 are respectively copper and nickel, the third metal ER13 contains an alloy of copper and nickel. When the third metal ER13 is an alloy of copper and nickel, the third metal ER13 is low in conductivity.

Such a third metal ER13 is produced at the time of laser patterning for the first electrode 201. Details will be described below. As illustrated in FIG. 8A, the first electrode 201 of the piezoelectric sheet 20X contains the first metal ER11 and the second metal ER12. Then, as illustrated in FIG. 8B, the first electrode 201 is etched with the laser La. When the first electrode 201 is irradiated with the laser La, the second metal ER12 is irradiated with the laser La. In this case, the second metal ER12 has heat generated by the laser La. As a result, the second metal ER12 is melted. In this case, the melted second metal ER12 flows in the Z+ direction (flows in the direction DIR1 illustrated in FIG. 8B). Thus, the side surface of the first metal ER11 is covered with the second metal ER12. Then, the first metal ER11 and the second metal ER12 are alloyed by the heat generated by the laser La at the surface of the first metal ER11. As a result, the third metal ER13 is produced, which is an alloy of the first metal ER11 and the second metal ER12. After the production of the third metal ER13, the laser irradiation is stopped. Thus, the third metal ER13 is solidified. As a result, the third metal ER13 is fixed to the side surfaces of the first electrode 201. More specifically, the third metal ER13 is located at the side surfaces of the first electrode 201 at the second parts A2. Through the foregoing steps, the third metal ER13 is produced. For example, when the first metal ER11 and the second metal ER12 are respectively formed of copper and nickel, the third metal ER13 is an alloy of copper and nickel.

In the case of producing the first electrode 201 as mentioned above, the wavelength of the laser La is set based on the light absorptivity of the second metal ER12. Specifically, the wavelength of the laser La is set to be a wavelength that is easily absorbed by the second metal ER12. A case where the second metal ER12 is nickel will be described below as an example. Nickel easily absorbs light of 700 nm or more in wavelength. Accordingly, the wavelength of the laser La is set to be 700 nm or more.

The wavelength of the laser La is set to be a wavelength that is more likely to be absorbed by the second metal ER12 than by the first metal ER11. For example, when the first metal ER11 and the second metal ER12 are respectively copper and nickel, the nickel is more likely to absorb light of 700 nm or more in wavelength than the copper. In this case, the wavelength of the laser La is set to be 700 nm or more.

In addition, the wavelength of the laser La is set based on the light transmittance of the film-shaped member 200. Specifically, the laser La is set to be a wavelength that is unlikely to be absorbed by the film-shaped member 200. For example, when the film-shaped member 200 is PVDF, the PVDF is low in transmittance of light with a wavelength of 1176 nm or of light with a wavelength of 1404 nm. Accordingly, when the PVDF is irradiated with a laser with a wavelength of 1176 nm or a wavelength of 1404 nm, the PVDF absorbs the light of the laser. Then, there is a possibility that the PVDF may be damaged. Thus, the wavelength of the laser is set to be a wavelength that is unlikely to be absorbed and is easily transmitted by the PVDF. Thus, the possibility of damaging the film-shaped member 200 can be reduced. The wavelength of light that is unlikely to be absorbed by PVDF is, for example, a wavelength of 1064 nm.

As described above, for example, when the first metal ER11 and the second metal ER12 are respectively copper and nickel, and when the film-shaped member 200 is PVDF, the wavelength of the laser La is set to be, for example, 1064 nm, thereby allowing the production of the first electrode 201.

In the same manner as the first electrode 201, the second electrode 202 includes a first metal ER21, a second metal ER22, and a third metal ER23 as illustrated in FIG. 9. The third metal ER23 is an alloy of the first metal ER21 and the second metal ER22. Such a second electrode 202 is formed by the laser La penetrating the first electrode 201. Details will be described below. After the formation of the first electrode 201, the laser La reaches the film-shaped member 200. The film-shaped member 200 transmits the laser La. Then, the laser La reaches the sixth main surface SF6 of the second electrode 202. In this case, as illustrated in FIG. 8, the first metal ER21 is melted by the laser La. Thus, the laser La penetrates the first metal ER21. The laser La penetrating the first metal ER21 reaches the second metal ER22. Thus, the laser La melts the second metal ER22. The melted second metal ER22 flows in the Z-direction (flows in the direction DIR2 illustrated in FIG. 8B). Thus, the first metal ER21 and the second metal ER22 are alloyed by the heat generated by the laser La at the surface of the first metal ER21. As a result, the third metal ER23 is produced, which is an alloy of the first metal ER21 and the second metal ER22. In this case, as illustrated in FIG. 9, parts of ends ED2 of the second electrode 202 are formed from the third metal ER23.

For the second electrode 202, as illustrated in FIG. 8, the first metal ER21 and the second metal ER22 are irradiated in this order with the laser La. The first metal ER21 is lower in light absorbance than the second metal ER22. In this case, the first metal ER21 is less likely to be heated by the laser La. In this case, the energy of the laser La is less likely to be transmitted to the second electrode 202. Accordingly, the area of the through-hole is reduced as the laser La travels in the Z+ direction. As a result, the side surfaces of the second electrode 202 are more likely to be inclined with respect to the Z-axis direction at the through-hole. In contrast, for the first electrode 201, the second metal ER12 and the first metal ER11 are irradiated in this order with the laser La. The second metal ER12 is higher in light absorbance than the first metal ER11. In this case, the second metal ER12 is more likely to be heated by the laser La. Then, the heat generated by the second metal ER12 is transferred to the first metal ER11. In this case, the energy of the laser La is more likely to be transmitted to the first electrode 201. Accordingly, the through hole is easily formed in the first electrode 201. As a result, the side surfaces of the first electrode 201 are less likely to be inclined with respect to the Z-axis direction at the through-hole. Accordingly, the magnitude of the first angle θ1 with respect to the Z direction at the first electrode 201 is smaller than the magnitude of the second angle θ2 at the second electrode 202.

(Advantageous Effect of First Metal ER11, Second Metal ER12, and Third Metal ER13)

For the substrate 1, the piezoelectric sheet 20 can be easily manufactured. More specifically, the first electrode 201 includes a first metal ER11, a second metal ER12, and a third metal ER13. The first metal ER11 is located close to the third main surface SF3 of the first electrode 201. The second metal ER12 is located close to the fourth main surface SF4 of the first metal ER11. The third metal ER13 is located close to the side surfaces SD1 of the first electrode 201 at the second parts A2. The second metal ER12 is higher in light absorbance than the first metal ER11. Further, the third metal ER13 is made of an alloy of the first metal ER11 and the second metal ER12. In this configuration, when the first electrode 201 is irradiated with a laser, the second metal ER12 is melted before the first metal ER11. Thus, the melted second metal ER12 flows toward the side surfaces of the first metal ER11. Accordingly, the first metal ER11 and the second metal ER12 are alloyed at the side surfaces of the first metal ER11. As a result, the piezoelectric sheet 20 with the third metal ER13 as an alloy of the first metal ER11 and the second metal ER12 can be easily manufactured.

In particular, when the first metal ER11, the second metal ER12, and the third metal ER13 respectively contain copper, nickel, and an alloy of copper and nickel in the first electrode 201, the piezoelectric sheet 20 is made unlikely to be damaged. In this case, parts of the ends ED1 of the first electrode 201 are formed from an alloy of copper and nickel. The alloy of copper and nickel is low in conductivity. Accordingly, when an alternate-current voltage is applied to the piezoelectric sheet 20, an electric field is unlikely to be concentrated on the ends ED1 of the first electrode 201. More specifically, the piezoelectric sheet 20 is unlikely to be significantly deformed at the ends ED1 of the first electrode 201. Accordingly, the piezoelectric sheet 20 is unlikely to be damaged at the ends ED1 of the first electrode 201.

Furthermore, when the first metal ER21, the second metal ER22, and the third metal ER23 respectively contain copper, nickel, and an alloy of copper and nickel in the second electrode 202, the piezoelectric sheet 20 is made further unlikely to be damaged. When the third metal ER23 is an alloy of copper and nickel, the conductivity of the third metal ER23 is decreased. In this case, parts of the ends ED2 of the second electrode 202 are formed from the alloy with the low conductivity. Accordingly, the piezoelectric sheet 20 is unlikely to be deformed at the ends ED2 of the second electrode 202 in the same manner as the piezoelectric sheet 20, which is unlikely to be deformed at the ends ED1 of the first electrode 201. Accordingly, the piezoelectric sheet 20 is unlikely to be damaged at the ends ED2 of the second electrode 202.

Second Embodiment

Figure 10:
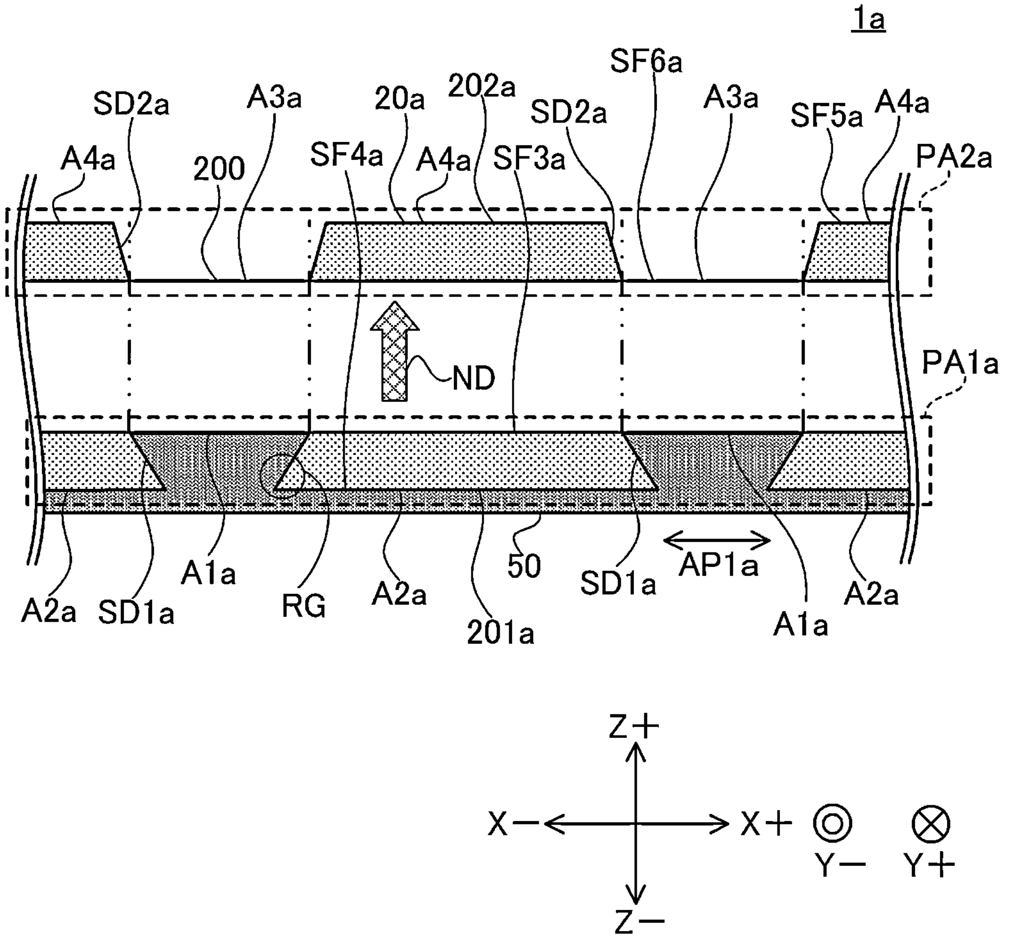
FIG. 10 is an A-A sectional view of a first electrode 201*a* in a substrate 1*a*.

A substrate 1*a* according to a second embodiment will be described below with reference to the drawing. FIG. 10 is an A-A sectional view of a first electrode 201*a* in the substrate 1*a*. FIG. 10 illustrates a first patterning region PA1*a* and the vicinity of the first patterning region PA1*a*. Accordingly, the illustration other than the first patterning region PA1*a* and the vicinity of the first patterning region PA1*a* is omitted in FIG. 10.

As illustrated in FIG. 10, a piezoelectric sheet 20*a* includes the first electrode 201*a*. The first electrode 201*a* at second parts A2*a* has no tapered shape. Specifically, the side surface SD1*a* of the first electrode 201*a* at the second part A2*a* is inclined with respect to the normal direction ND of a first main surface SF1*a* and a second main surface SF2*a* in a planar view of the substrate 1*a*. Further, the area of a third main surface SF3*a* of the first electrode 201*a* at the second part A2*a* is larger than the area of an opening AP1*a* of a fourth main surface SF4*a*. In this case, the area of the third main surface SF3*a* of the first electrode 201*a* in the first patterning region PA1*a* is larger than the area of the opening AP1*a* of the fourth main surface SF4*a*. In other words, the sectional area of the first electrode 201*a* is increased with distance from the film-shaped member 200. In the case of the configuration mentioned above, an adhesive tape 50 is bonded to the side surfaces SD1*a* of the first electrode 201*a* so as to enter a first part A1*a*. Specifically, the adhesive tape 50 is bonded to the first electrode 201*a* along the side surfaces SD1*a* of the first electrode 201*a*. In this case, a part RG is present in which the adhesive tape 50 and the first electrode 201*a* are arranged in this order in the Z-direction.

In addition, the piezoelectric sheet 20*a* includes a second electrode 202*a* that differs in shape from the second electrode 202. Specifically, the second electrode 202*a* has a shape tapered in the Z+ direction. More specifically, the side surface of the second electrode 202*a* at a fourth part A4*a* is inclined with respect to the normal direction ND in a side view of the substrate 1*a*. Further, the area of a fifth main surface SF5*a* of the second electrode 202*a* in the second patterning region PA2*a* is smaller than the area of an opening of a sixth main surface SF6*a* thereof.

(Advantageous Effect of Second Embodiment)

The substrate 1*a* makes the diaphragm 10 and the piezoelectric sheet 20*a* further unlikely to be peeled off. More specifically, the area of the third main surface SF3*a* of the first electrode 201*a* in the first patterning region PA1*a* is larger than the area of the opening AP1*a* of the fourth main surface SF4*a*. Thus, the part RG is present in which the adhesive tape 50 and the first electrode 201*a* are arranged in this order in the Z-direction. Further, the adhesive tape 50 is bonded to the first electrode 201*a* along the side surfaces SD1*a* of the first electrode 201*a*. In this case, when the adhesive tape 50 tries to peel off, the adhesive tape 50 is caught on the part RG. Accordingly, the adhesive tape 50 and the first electrode 201*a* are made less likely to be peeled off. In other words, when the adhesive tape 50 is attached to the side surfaces SD1*a* of the first electrode 201*a*, an anchor effect is generated. Accordingly, the diaphragm 10 and the piezoelectric sheet 20*a* are made further unlikely to be peeled off.

Modification Example 1

Figure 11:
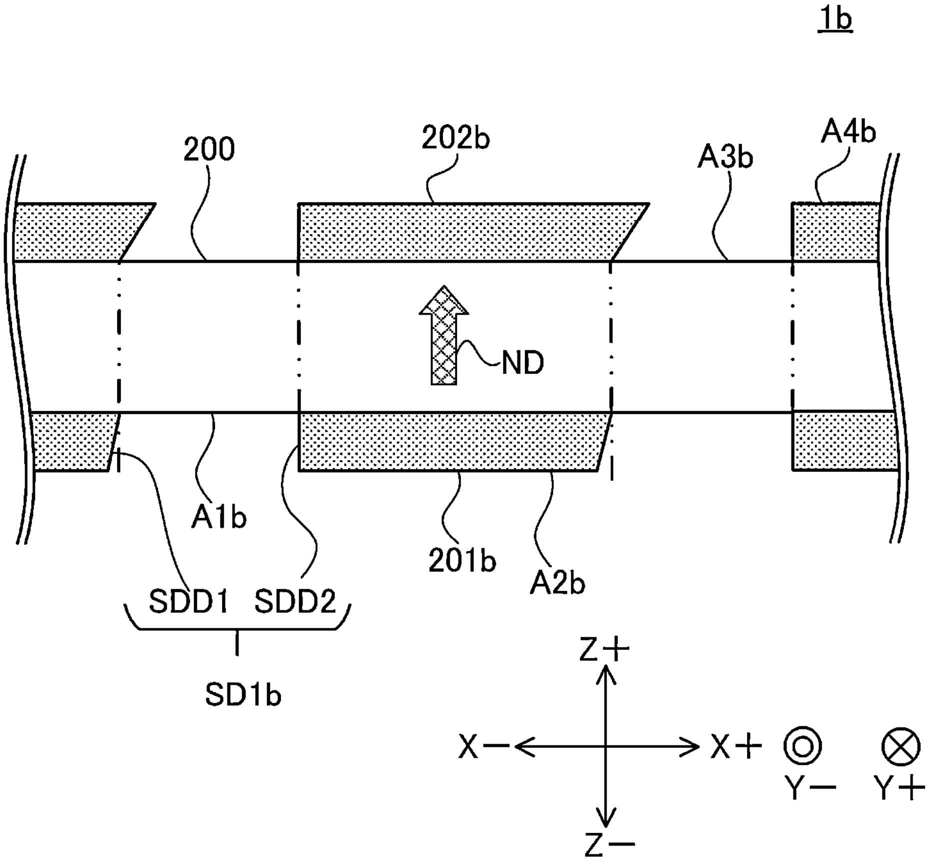
FIG. 11 is an A-A sectional view of a first electrode 201*b* in a substrate 1*b*.

A substrate 1*b* according to Modification Example 1 of the substrate 1 and substrate 1*a* will be described below with reference to the drawing. FIG. 11 is an A-A sectional view of a first electrode 201*b* in the substrate 1*b*. FIG. 11 illustrates only a part of a first patterning region PA1*b*. Accordingly, the illustration other than the part of the first patterning region PA1*b* is omitted in FIG. 11.

As illustrated in FIG. 11, the substrate 1*b* differs from the substrate 1 in that the substrate 1*b* includes a first electrode 201*b* that differs in shape from the first electrode 201. Specifically, the side surface SD1*b* of the first electrode 201*b* at a second part A2 has a first side surface SDD1 and a second side surface SDD2. Each of the first side surface SDD1 and the second side surface SDD2 are inclined with respect to the normal direction ND of the first main surface SF1 and second main surface SF2 in a side view of the substrate 1. Further, the inclination angle of the first side surface SDD1 is different from the inclination angle of the second side surface SDD2. In FIG. 11, the first side surface SDD1 is inclined with respect to the normal direction ND. In contrast, the second side surface SDD2 is slightly inclined with respect to the normal direction ND. In this case, the angle made by the first side surface SDD1 and the normal direction ND is larger than an angle made by the second side surface SDD2 and the normal direction ND. The substrate 1*b* including the configuration mentioned above can achieve the same advantageous effect as that of the substrate 1. More specifically, the first side surface SDD1 or the second side surface SDD2 is inclined with respect to the normal direction ND, thereby increasing the area of the side surfaces SD1*b* of the first electrode 201*b*, bonded to the adhesive tape 50. More specifically, the side surface SD1*b* of the first electrode 201*b* at the second part A2 has at least one site inclined with respect to the normal direction ND, thereby making the diaphragm 10 and the piezoelectric sheet 20*b* unlikely to be peeled off.

It is to be noted that the second side surface SDD2 is slightly inclined with respect to the normal direction ND in FIG. 11. The second side surface SDD2 is, however, not necessarily inclined with respect to the normal direction ND. Specifically, as long as the first side surface SDD1 is inclined with respect to the normal direction ND, the second side surface SDD2 is not necessarily inclined with respect to the normal direction ND. Also in this case, the diaphragm 10 and the piezoelectric sheet 20*b* are unlikely to be peeled off.

Modification Example 2

Figure 12:
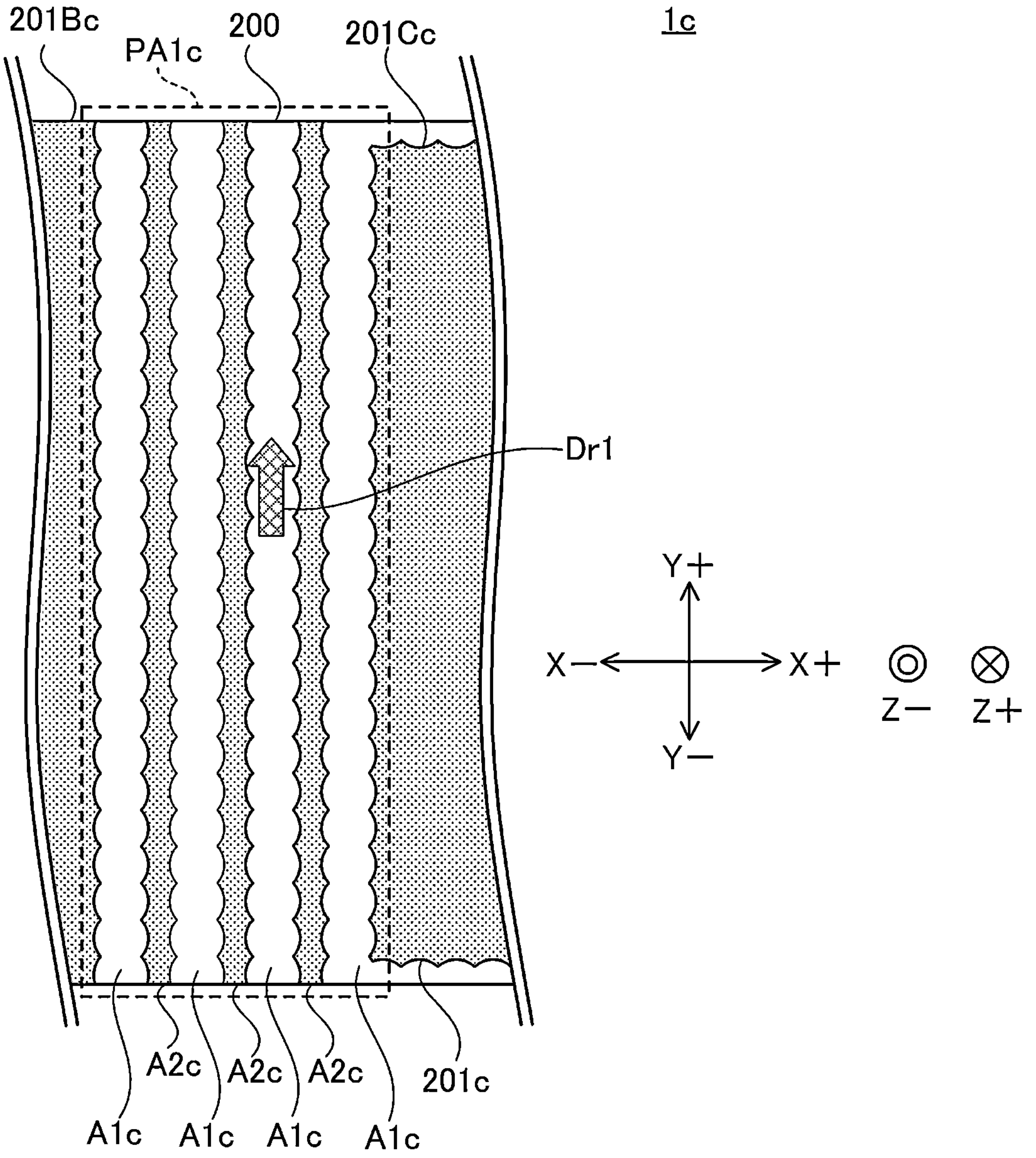
FIG. 12 is an enlarged view of a first patterning region PA1*c* in a substrate 1*c*.
Figure 13:
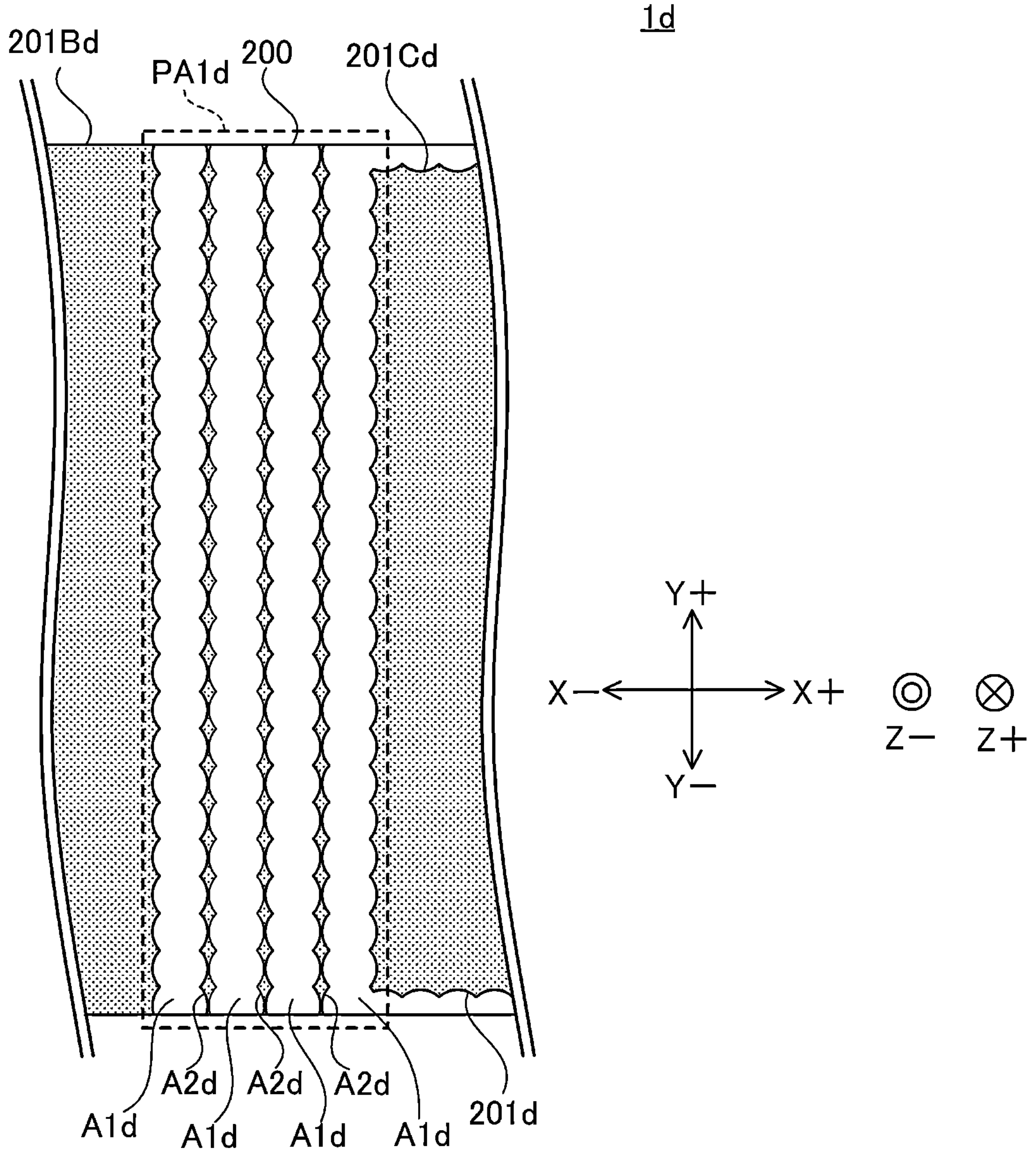
FIG. 13 is an enlarged view of a first patterning region PA1*d* in a substrate 1*d*.

A substrate 1*c* and a substrate 1*d* according to Modification Example 2 of the substrate 1 will be described below with reference to the drawings. FIG. 12 is an enlarged view of a first patterning region PA1*c* in the substrate 1*c*. The illustration other than the first patterning region PA1*c* and the vicinity of the first patterning region PA1*c* is omitted in FIG. 12. FIG. 13 is an enlarged view of a first patterning region PA1*d* in the substrate 1*d*. The illustration other than the first patterning region PA1*d* and the vicinity of the first patterning region PA1*d* is omitted in FIG. 13.

As illustrated in FIG. 12, the substrate 1*c* differs from the substrate 1 in that the substrate 1*c* includes a first electrode 201*c* that differs in shape from the first electrode 201. Specifically, the first patterning region PA1*c* of the first electrode 201*c* has second parts A2*c*. Further, the second parts A2*c* differ in shape from the second parts A2. More specifically, as illustrated in FIG. 12, the first electrode 201*c* at the second parts A2*c* extends in a first direction Dr1 in a planar view of the substrate 1*c*. In addition, there are a plurality of first parts A1*c* extending in the first direction Dr1. In this case, the first electrode 201*c* at the second parts A2*c* is located between the plurality of first parts A1*c* in a planar view of the substrate 1*c*. Accordingly, in the first patterning region PA1*c*, the first parts A1*c* and the second parts A2*c* are alternately arranged in this order in the X+ direction or the X-direction.

According to the present modification example, the first electrode 201*c* at the second parts A2*c* extends in a direction perpendicular to the direction in which a tension is applied to the film-shaped member 200. In other words, the first direction Dr1 is perpendicular to the direction of the tension applied to the film-shaped member 200. Specifically, in the present modification example, when an alternate-current voltage is applied to the film-shaped member 200, a tension is applied to the film-shaped member 200 in the X-axis direction. Accordingly, the first electrode 201*c* at the second parts A2*c* is formed to extend in the Y-axis direction.

It is to be noted that the length of the width of the second part A2*c* in the X-axis direction is not limited to the example illustrated in FIG. 12. As long as the first electrode 201*c* is electrically divided, the width of the second parts A2*c* may have any length. The substrate 1*d* according to Modification Example 2 will be described below as an example. As illustrated in FIG. 13, the substrate 1*d* includes a first electrode 201*d*. The first electrode 201*d* has a first end 201Bd and a central part 201Cd electrically divided by a first part A1*d*. Further, the width of the second part A2*d* in the X-axis direction is smaller than the width of the second part A2*c* in the X-axis direction. Such a substrate 1*d* also produces the same advantageous effect as that of the substrate 1*c*. It is to be noted that the first electrode 201*d* is electrically divided, the width of the second part A2*d* in the X-axis direction may be larger than the width of the second part A2*c* in the X-axis direction.

(Advantageous Effect of Modification Example 2)

The substrate 1*c* makes the diaphragm 10 and a piezoelectric sheet 20*c* unlikely to be peeled off. Specifically, the first electrode 201*c* at the second parts A2*c* extends in the first direction Dr1 in a planar view of the substrate 1*c*. Further, the first direction Dr1 is perpendicular to the direction of the tension applied to the film-shaped member 200. Thus, if the film-shaped member 200 has a tension generated by applying an alternate-current voltage to the film-shaped member 200, the adhesive tape 50 and the film-shaped member 200 are unlikely to be peeled off. A comparative example including no first electrode extending perpendicular to the first direction will be described below in comparison with the substrate 1*c*. In the case of the comparative example, when the film-shaped member has a tension generated, the adhesive tape bonded to the film-shaped member is pulled in the direction of the tension. In this case, there is a possibility that the adhesive tape pulled may be then peeled off from the piezoelectric sheet in the comparative example. In contrast, in the substrate 1*c*, the first electrode 201*c* extends in the first direction Dr1. In this case, the adhesive tape 50 pulled by the tension is easily caught by the first electrode 201 extending in the first direction Dr1. Accordingly, there is a low possibility that the adhesive tape 50 is peeled off by a tension from the film-shaped member 200 and the first electrode 201. Accordingly, the adhesive tape 50 is made unlikely to be peeled off from the piezoelectric sheet 20.

Modification Example 3

Figure 14:
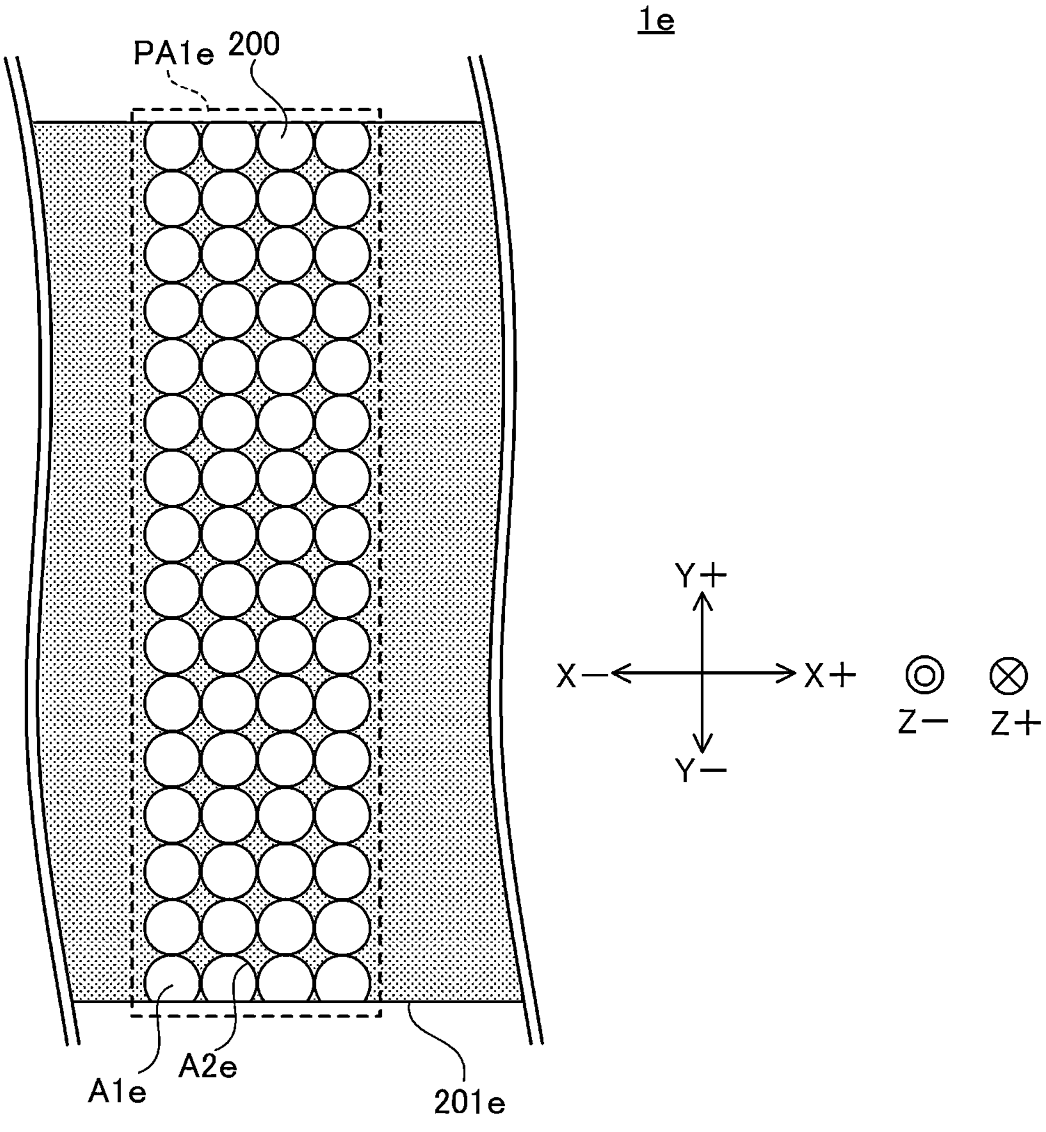
FIG. 14 is an enlarged view of a first patterning region PA1*e* in a substrate 1*e*.
Figure 15:
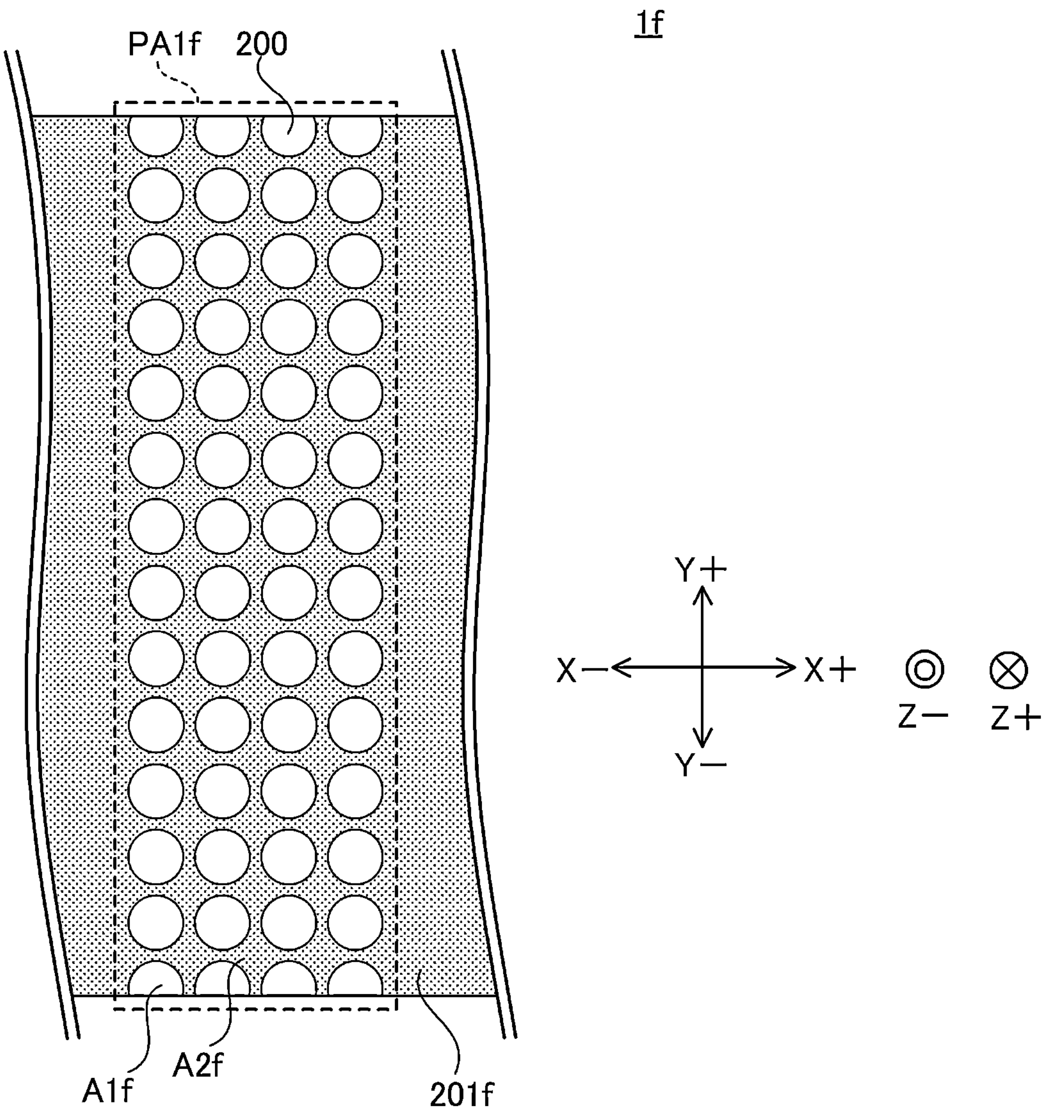
FIG. 15 is an enlarged view of a first patterning region PA1*f* in a substrate 1*f*.

A substrate 1*e* and a substrate 1*f* according to Modification Example 3 of the substrate 1 will be described below with reference to the drawings. FIG. 14 is an enlarged view of a first patterning region PA1*e* in the substrate 1*e*. The illustration other than the first patterning region PA1*e* and the vicinity of the first patterning region PA1*e* is omitted in FIG. 14. FIG. 15 is an enlarged view of a first patterning region PA1*f* in the substrate 1*f*. The illustration other than the first patterning region PA1*f* and the vicinity of the first patterning region PA1*f* is omitted in FIG. 15.

As illustrated in FIG. 14, the substrate 1*e* includes a first electrode 201*e*. For the first electrode 201*e*, a part that is not required to be electrically divided is further subjected to patterning. Specifically, the first patterning region PA1*e* of the first electrode 201*e* has first parts A1*e* and second parts A2*e*. Further, the first electrode 201*e* is not electrically divided by the first parts A1*e*. Further, the adhesive tape 50 is bonded to the first patterning region PA1*e*. As described above, the part that is not required to be electrically divided may be subjected to patterning, and the adhesive tape 50 may be bonded to the part subjected to the patterning. Also in this case, the piezoelectric sheet 20 and the diaphragm 10 are made unlikely to be peeled off.

It is to be noted that the length of the distance between the respective first parts A1*e* arranged in the X-axis direction is not limited to the example illustrated in FIG. 14. In addition, the length of the distance between the respective first parts A1*e* arranged in the Y-axis direction is not limited to the example illustrated in FIG. 14. The length of the distance between the respective first parts A1*e* may be any length. The substrate 1*f* according to Modification Example 3 will be described below as an example. As illustrated in FIG. 15, the substrate 1*f* includes a first electrode 201*f*. The first electrode 201*f* has a plurality of first parts A1*f* provided. Further, the interval between the respective first parts A1*f* is longer than the interval between the respective first parts A1*e* of the first electrode 201*e*. Such a substrate 1*f* also produces the same advantageous effect as that of the substrate 1*e*.

Modification Example 4

Figure 16:
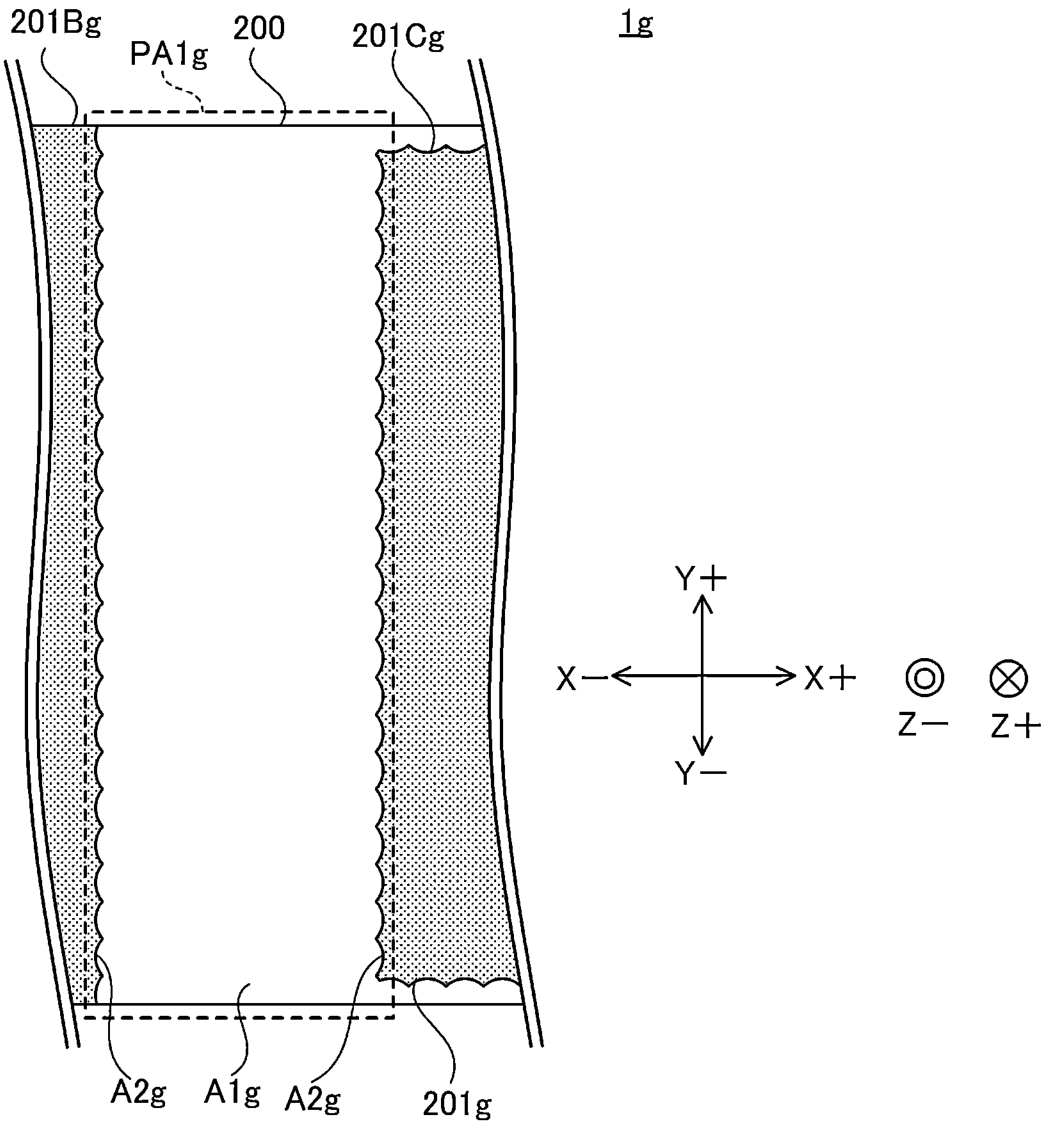
FIG. 16 is an enlarged view of a first patterning region PA1*g* in a substrate 1*g*.

A substrate 1*g* according to Modification Example 4 of the substrate 1 will be described below with reference to the drawing. FIG. 16 is an enlarged view of a first patterning region PA1*g* in the substrate 1*g*. The illustration other than the first patterning region PA1*g* and the vicinity of the first patterning region PA1*g* is omitted in FIG. 16.

As illustrated in FIG. 16, the substrate 1*g* differs from the substrate 1 in that the substrate 1*g* includes a first electrode 201*g* that differs in shape from the first electrode 201. Specifically, the first patterning region PA1*g* of the first electrode 201*g* has a first part A1*g*. The substrate 1*g* has no second part A2*g* surrounded by the first part A1*g*. More specifically, in the substrate 1*g*, the second part A2*g* is present at the side surface of a first and 201Bg and the side surface of a central part 201Cg. As illustrated in FIG. 16, the side surface of the first end 201Bg is formed by laser patterning. Accordingly, the side surface of the first end 201Bg is inclined. The side surface of the first end 201Bg is inclined, thereby increasing the area of the first electrode 201*g* with the adhesive tape 50 bonded thereto. Accordingly, the substrate 1*g* has adhesive strength increased between the adhesive tape 50 and the first electrode 201*g*, as compared with the substrate in which the side surface of the first end is not inclined. Similarly, according to the present modification example, the side surface of the central part 201C is inclined. Accordingly, the area of the first electrode 201*g* with the adhesive tape 50 bonded thereto is increased. As a result, the adhesive strength between the adhesive tape 50 and the first electrode 201*g* is increased.

In addition, according to the present modification, the end surface of the first end 201Bg is not a flat surface. Specifically, when the first electrode 201*g* is subjected to patterning with a laser, the end surface of the first end 201Bg is not linear but curved with irregularities in a planar view of the substrate 1. Accordingly, for the first electrode 201*g*, the area of the first electrode 201*g* with the adhesive tape 50 bonded thereto is increased as compared with the case where the end surface of the first end is a flat surface. As a result, the adhesive strength between the adhesive tape 50 and the first electrode 201*g* is increased.

Other Embodiments

The substrates 1 to 1*g* according to the present invention are not limited to the substrates 1 to 1*g*, and can be changed within the scope of the invention. It is to be noted that the configurations of the substrates 1 to 1*g* may be arbitrarily combined.

Further, according to the first embodiment, the frequency of the alternate-current voltage applied to the film-shaped member 200 is set based on the resonance frequency of the diaphragm 10, thereby making the diaphragm 10 more likely to resonate. Accordingly, the substrate 1 can be efficiently vibrated.

It is to be noted that the number of openings KA in the diaphragm 10 is not necessarily 2. The number of openings KA may be 1. Alternatively, the number of openings KA may be 3 or more.

It is to be noted that the number of beams 102 included in the diaphragm 10 is not necessarily 2. The number of beams 102 may be 1. Alternatively, the number of beams 102 may be 3 or more.

It is to be noted that the diaphragm 10 is not necessarily formed from a material that is high in workability, durability, and rigidity. The diaphragm 10 may be made from, for example, an acrylic resin, a polyethylene terephthalate, a polycarbonate, a glass epoxy, FRP (Fiber Reinforced Plastics), a metal, glass, or the like.

It is to be noted that there is not always a need for the film-shaped member 200 to be formed from a material that has water resistance. The film-shaped member 200 may be formed from, for example, a material made of a chiral polymer. The chiral polymer encompasses, for example, a polylactic acid. The polylactic acid is a material that has no pyroelectricity. Accordingly, when the film-shaped member 200 is formed from a polylactic acid, the change in the temperature of the film-shaped member 200 will not interfere with the generation of vibrations. The polylactic acid encompasses, for example, a poly-L-lactic acid (PLLA), a poly-D-lactic acid, and the like.

It is to be noted that the adhesive tape 50 is not necessarily bonded to the side surfaces of the first electrodes 201 to 201*g* at the second parts A2 to A2*g*.

It is to be noted that the side surfaces of the first electrodes 201 to 201*g* at the second parts A2 to A2*g* are not necessarily inclined with respect to the normal direction ND.

It is to be noted that there is not always a need for the second parts A2, A2*a*, and A2*c* to A2*g* to include the first side surface SDD1 and the second side surface SDD2.

It is to be noted that in the substrates 1 to 1*g*, the magnitude of the first angle θ1 is not necessarily smaller than the magnitude of the second angle θ2.

It is to be noted that in the substrates 1 to 1*g*, the areas of the sixth main surfaces SF6 to SF6*g* of the second electrodes 202 to 202*g* in the second patterning regions PA2 to PA2*g* are not necessarily smaller than the areas of the openings of the fifth main surfaces SF5 to SF5*g*.

It is to be noted that there is not always a need for the substrates 1 to 1*g* to include the first metal ER11, the second metal ER12, and the third metal ER13.

It is to be noted that there is not always a need for the second metal ER12 to be higher in light absorbance than the first metal ER11.

It is to be noted that there is not always a need for the first metal ER11 to contain copper. It is to be noted that there is not always a need for the second metal ER12 to contain nickel. It is to be noted that there is no need for the third metal ER13 to contain an alloy of copper and nickel.

It is to be noted that in the first embodiment, the first patterning region PA1 may be a region located between the second end 201F and the central part 201C. Further, the second patterning region PA2 may be a region located between the second end 202F and the central part 202C.

It is to be noted that the patterning with a laser is, for example, patterning with a laser processing machine. The laser processing machine is, for example, a fiber laser processing machine.

It is to be noted that the object with the film-shaped member 200 attached thereto is the diaphragm 10 in the first embodiment, the second embodiment, and the modification examples 1 to 4. The object is, however, not necessarily the diaphragm 10. The target object may be any object as long as the film-shaped member 200 can be attached to the object. For example, the object may be a sensor or the like. In this case, the substrates 1 to 1*g* according to the first embodiment, the second embodiment, and the modification examples 1 to 4 are capable of reducing the possibility that the film-shaped member 200 is peeled off from the sensor or the like.

DESCRIPTION OF REFERENCE SYMBOLS

1 to 1*g*: Substrate
10: Diaphragm
20, 20*a* to 20*c*: Piezoelectric sheet
30: FPC
40: Conductive adhesive
50: Adhesive tape
200: Film-shaped member
201 to 201*g*: First electrode
202: Second electrode
A1 to A1*g*: First part
A2 to A2*g*: Second part
PA1 to PA1*g*: First patterning region
SF1: First main surface
SF2: Second main surface
SF3: Third main surface
SF4: Fourth main surface

The invention claimed is:

1. A substrate comprising:

a film-shaped member that has a first main surface and a second main surface;

a first electrode that has a third main surface and a fourth main surface, the third main surface facing the second main surface of the film-shaped member, the first electrode having a first patterning region with a first part where the film-shaped member is exposed from the first electrode and a second part where the film-shaped member is not exposed from the first electrode; and an adhesive tape facing the fourth main surface of the first electrode and the second main surface of the film-shaped member such that the adhesive tape is disposed across the first part and the second part in the first patterning region, wherein:

a side surface of the first electrode at the second part has a first side surface and a second side surface, each of the first side surface and the second side surface is inclined with respect to a normal direction of the first main surface and the second main surface in a side view of the substrate, and an inclination angle of the first side surface is different from an inclination angle of the second side surface.

2. The substrate according to claim 1, wherein the adhesive tape is bonded to the film-shaped member exposed from the first electrode at the first part.

3. The substrate according to claim 1, wherein the adhesive tape is bonded to the fourth main surface of the first electrode at the second part.

4. The substrate according to claim 1, wherein the adhesive tape is bonded to a side surface of the first electrode at the second part.

5. The substrate according to claim 4, wherein the adhesive tape is bonded to the film-shaped member exposed from the first electrode at the first part.

6. The substrate according to claim 5, wherein the adhesive tape is bonded to the fourth main surface of the first electrode at the second part.

7. The substrate according to claim 1, wherein a side surface of the first electrode at the second part is inclined with respect to a normal direction of the first main surface and the second main surface in a side view of the substrate.

8. The substrate according to claim 1, wherein an area of the third main surface of the first electrode at the first part is smaller than an area of an opening of the fourth main surface.

9. The substrate according to claim 1, wherein an area of the third main surface of the first electrode at the first part is larger than an area of an opening of the fourth main surface.

10. The substrate according to claim 1, wherein the first electrode at the second part extends in a first direction in a planar view of the substrate, and the first direction is perpendicular to a tension direction of the film-shaped member.

11. The substrate according to claim 1, further comprising:

a second electrode having a fifth main surface and a sixth main surface, the sixth main surface facing the first main surface of the film-shaped member, the second electrode having a second patterning region with a third part where the film-shaped member is exposed from the second electrode and a fourth part where the film-shaped member is not exposed from the second electrode.

12. The substrate according to claim 11, wherein an area of the sixth main surface of the second electrode in the second patterning region is smaller than an area of an opening of the fifth main surface.

13. A substrate comprising:

a film-shaped member that has a first main surface and a second main surface;

a first electrode that has a third main surface and a fourth main surface, the third main surface facing the second main surface of the film-shaped member, the first electrode having a first patterning region with a first part where the film-shaped member is exposed from the first electrode and a second part where the film-shaped member is not exposed from the first electrode;

a second electrode having a fifth main surface and a sixth main surface, the sixth main surface facing the first main surface of the film-shaped member, the second electrode having a second patterning region with a third part where the film-shaped member is exposed from the second electrode and a fourth part where the film-shaped member is not exposed from the second electrode; and an adhesive tape facing the fourth main surface of the first electrode and the second main surface of the film-shaped member such that the adhesive tape is disposed across the first part and the second part in the first patterning region, wherein:

a side surface of the first electrode at the second part is inclined with respect to a normal direction of the first main surface and the second main surface in a side view of the substrate, a side surface of the second electrode at the fourth part is inclined with respect to the normal direction in the side view of the substrate, and a magnitude of a first angle between the side surface of the first electrode at the second part and a first straight line extending in the normal direction is smaller than a magnitude of a second angle between the side surface of the second electrode at the fourth part and the first straight line in the side view of the substrate.

14. A substrate comprising:

a film-shaped member that has a first main surface and a second main surface;

a first electrode that has a third main surface and a fourth main surface, the third main surface facing the second main surface of the film-shaped member, the first electrode having a first patterning region with a first part where the film-shaped member is exposed from the first electrode and a second part where the film-shaped member is not exposed from the first electrode; and an adhesive tape facing the fourth main surface of the first electrode and the second main surface of the film-shaped member such that the adhesive tape is disposed across the first part and the second part in the first patterning region, wherein:

the first electrode includes a first metal, a second metal that is higher in light absorbance than the first metal, and a third metal including an alloy of the first metal and the second metal, the first metal is located closest to the third main surface of the first electrode, the second metal is located closest to the fourth main surface of the first electrode, and the third metal is located closest to a side surface of the first electrode at the second part.

15. The substrate according to claim 14, wherein the first metal includes copper, the second metal includes nickel, and the third metal includes an alloy of the copper and the nickel.

* * * * *